United States Patent
Sakuma et al.

(10) Patent No.: US 8,508,119 B2
(45) Date of Patent: Aug. 13, 2013

(54) PHOSPHOR AND AN INCANDESCENT LAMP COLOR LIGHT EMITTING DIODE LAMP USING THE SAME

(75) Inventors: Ken Sakuma, Sakura (JP); Koji Omichi, Sakura (JP); Naoki Kimura, Sakura (JP); Masakazu Ohashi, Sakura (JP); Daiichiro Tanaka, Sakura (JP); Naoto Hirosaki, Tsukuba (JP)

(73) Assignees: Fujikura Ltd., Tokyo (JP); National Institute for Materials Science, Ibaraki (JP)

( * ) Notice: Subject to any disclaimer, the term of this patent is extended or adjusted under 35 U.S.C. 154(b) by 1494 days.

(21) Appl. No.: 11/178,363

(22) Filed: Jul. 12, 2005

(65) Prior Publication Data
US 2006/0061263 A1    Mar. 23, 2006

(30) Foreign Application Priority Data

Jul. 13, 2004 (JP) ............................... P2004-206509
Aug. 13, 2004 (JP) ............................... P2004-235945

(51) Int. Cl.
*H01J 1/62* (2006.01)
*C09K 11/02* (2006.01)

(52) U.S. Cl.
USPC ................................. 313/503; 252/304.1 R

(58) Field of Classification Search
USPC .......................................... 313/503; 252/500
See application file for complete search history.

(56) References Cited

U.S. PATENT DOCUMENTS

| 5,998,925 | A | 12/1999 | Shimizu et al. |
| 6,069,440 | A | 5/2000 | Shimizu et al. |
| 6,522,065 | B1 * | 2/2003 | Srivastava et al. ............ 313/503 |
| 6,592,780 | B2 | 7/2003 | Hohn et al. |

(Continued)

FOREIGN PATENT DOCUMENTS

| EP | 1 264 873 A2 | 12/2002 |
| EP | 1 278 250 A2 | 1/2003 |

(Continued)

OTHER PUBLICATIONS

S. Nakamura, "Present Performance of InGaN based blue/green/yellow LEDs," Proc. SPIE 3002, pp. 26-35(1997).

(Continued)

*Primary Examiner* — Melvin C Mayes
*Assistant Examiner* — Stefanie Cohen
(74) *Attorney, Agent, or Firm* — Sughrue Mion, PLLC

(57) ABSTRACT

An incandescent lamp color light emitting diode lamp comprises a semiconductor blue light emitting diode chip having a center emission wavelength in a range of from 400 nm to 480 nm and a phosphor that absorbs light emitted from the diode chip to emit light having a different wavelength than the light emitted from the diode chip. The phosphor is represented by a general formula of $M_p(Si, Al)_{12}(O, N)_{16}{:}Eu^{2+}_q$. The main phase is an α-SiAlON phosphor having an α SiAlON structure, wherein M is at least one element of Ca, Y, Mg, Li, Sc, Pr, Nd, Pm, Sm, Gd, Tb, Dy, Ho, Er, Tm, Yb, Lu, and Sr and p is from 0.75 to 1.0; and q is between 0.02 and 0.09. The diode lamp emits light having an emission color produced by a mixture of the light emitted from the semiconductor blue light emitting and the light emitted from the α-SiAlON. The chromaticity range thereof falls within the range defined by chromaticity coordinates (x, y) of (0.4775, 0.4283), (0.4594, 0.3971), (0.4348, 0.4185), and (0.4214, 0.3887) on the XYZ chromaticity diagram.

14 Claims, 32 Drawing Sheets

(56) References Cited

U.S. PATENT DOCUMENTS

| | | | |
|---|---|---|---|
| 6,614,179 B1 | 9/2003 | Shimizu et al. | |
| 6,632,379 B2 | 10/2003 | Mitomo et al. | |
| 6,657,379 B2 | 12/2003 | Ellens et al. | |
| 6,670,748 B2 * | 12/2003 | Ellens et al. | 313/503 |
| 6,680,569 B2 | 1/2004 | Mueller-Mach et al. | |
| 2003/0168643 A1 | 9/2003 | Mitomo et al. | |
| 2005/0285506 A1 | 12/2005 | Sakuma et al. | |
| 2007/0164308 A1 * | 7/2007 | Yoshimura et al. | 257/103 |

FOREIGN PATENT DOCUMENTS

| | | | |
|---|---|---|---|
| EP | 1 357 610 A1 | 10/2003 | |
| JP | 2900928 B2 | 3/1999 | |
| JP | 2927279 B2 | 5/1999 | |
| JP | 3364229 B2 | 10/2002 | |
| JP | 2002-363554 A | 12/2002 | |
| JP | 2003-124527 A | 4/2003 | |
| JP | 2003-179269 A | 6/2003 | |
| JP | 2003-273409 A | 9/2003 | |
| JP | 2003-321675 A | 11/2003 | |
| JP | 2003-336059 A | 11/2003 | |
| JP | 2004186278 | * | 2/2004 |
| JP | 2004-067837 A | 3/2004 | |
| JP | 2004-186278 A | 7/2004 | |
| JP | 2004-238505 A | 8/2004 | |
| JP | 2005-306692 A | 11/2005 | |

OTHER PUBLICATIONS

"Development of High-bright and Pure-white LED Lamps", K. Bando, K. Sakano, Y. Noguchi and Y. Shimizu, J. Light & Vis. Env. vol. 22, No. 1(1998), pp. 2-5).

R. Mueller- Mach, G.O. Mueller, M.R. Krames and T. Trottier, IEEE J. Selected Topics Quantum Electron., vol. 8, No. 2, pp. 339-345(2002).

M. Yamada, T. Naitou, K. Izuno, H. Tamaki, Y. Murazaki, M. Kameshima and T. Mukai, Jpn. J. Appl. Phys., vol. 42(2003) pp. L20-L23.

R.J. Xie, M. Mitomo, K. Uheda, F.F. Xu and Y. Akimune, J. Am. Ceram. Soc., 85[5] 1229-1234 (2002).

J.W.H. van Krevel, J.W.T. van Rutten, H. Mandal, H.T. Hintzen, and R.Metselaar, J. Solid State Chem., 165, 19-24 (2002).

G.Z. Cao and R. Metselaar, Chem. Mater., 1991, 3, 242-252.

Z.J. Shen, M. Nygren, and U. Halenius, J. Mater. Sci. Lett., 16, pp. 263-266 (1997).

Joost Willem Hendrik van Krevel, "On new rare-earth doped M-Si-Al-O-N materials: Luminescence Properties and oxidation resistance," Technische Universiteit Eindhoven, 2000, ISBN 90-386-2711-4.

H. Mandal and M.J. Hoffmann, "Preparation of Multiple-Cation □-SiAION Ceramics Containing Lanthanum," J. Am. Ceram.Soc., 82 [1] 229-32 (1999).

Japanese Industrial Standard (JIS) Z 9112-1990, "Classification of Fluorescent Lamps by Chromaticity and Colour Rendering Property".

ANSI C78.376-2001, "Specifications for the Chromaticity of Fluorescent Lamps," American National Standards Lighting Group—National Electrical Manufacturers Association.

* cited by examiner

FIG.1

| SAMPLE | COMPOSITION DESIGN | | MIXTURE COMPOSITION (UNIT : % BY MASS) | | | |
|---|---|---|---|---|---|---|
| | p (Ca) | q (Eu) | $Si_3N_4$ | AlN | $CaCO_3$ | $Eu_2O_3$ |
| #1 | 0.875 | 0.02 | 68.20 | 17.48 | 13.76 | 0.55 |
| #2 | 0.875 | 0.04 | 67.23 | 17.98 | 13.69 | 1.10 |
| #3 | 0.875 | 0.0833 | 65.14 | 19.03 | 13.56 | 2.27 |
| #4 | 0.875 | 0.25 | 57.49 | 22.91 | 13.05 | 6.55 |
| #5 | 0.875 | 0.5 | 47.02 | 28.20 | 12.36 | 12.42 |
| #6 | 0.75 | 0.02 | 72.14 | 15.32 | 11.99 | 0.56 |
| #7 | 0.75 | 0.04 | 71.11 | 15.83 | 11.94 | 1.12 |
| #8 | 0.75 | 0.0833 | 68.96 | 16.92 | 11.81 | 2.30 |
| #9 | 0.75 | 0.25 | 61.04 | 20.94 | 11.36 | 6.66 |
| #10 | 0.75 | 0.5 | 50.23 | 26.42 | 10.75 | 12.60 |
| #11 | 1 | 0.02 | 64.41 | 19.58 | 15.47 | 0.54 |
| #12 | 1 | 0.04 | 63.46 | 20.05 | 15.41 | 1.08 |
| #13 | 1 | 0.0833 | 61.44 | 21.08 | 15.25 | 2.23 |
| #14 | 1 | 0.25 | 54.04 | 24.82 | 14.69 | 6.45 |
| #15 | 1 | 0.5 | 43.90 | 29.93 | 13.92 | 12.24 |
| #16 | 1.25 | 0.02 | 57.16 | 23.58 | 18.74 | 0.52 |
| #17 | 1.25 | 0.04 | 56.27 | 24.02 | 18.66 | 1.05 |
| #18 | 1.25 | 0.0833 | 54.38 | 24.97 | 18.48 | 2.17 |
| #19 | 1.25 | 0.25 | 47.46 | 28.46 | 17.81 | 6.27 |
| #20 | 1.25 | 0.5 | 37.93 | 33.26 | 16.92 | 11.89 |
| #21 | 0.5 | 0.04 | 79.31 | 11.32 | 8.22 | 1.16 |
| #22 | 0.5 | 0.0833 | 76.98 | 12.50 | 8.14 | 2.38 |
| #23 | 0.5 | 0.25 | 68.49 | 16.81 | 7.82 | 6.88 |

FIG.2

| SAMPLE | PEAK EMISSION WAVELENGTH [nm] | PEAK EXCITATION WAVELENGTH [nm] | EMISSION INTENSITY [a.u] |
|---|---|---|---|
| #1 | 571 | 392 | 2570 |
| #2 | 570 | 400 | 2897 |
| #3 | 582 | 410 | 3981 |
| #4 | 586 | 435 | 2839 |
| #5 | 587 | 449 | 2345 |
| #6 | 573 | 401 | 1926 |
| #7 | 574 | 396 | 2892 |
| #8 | 582 | 404 | 2919 |
| #9 | 586 | 440 | 2720 |
| #10 | 584 | 450 | 2078 |
| #11 | 570 | 394 | 2109 |
| #12 | 577 | 397 | 2948 |
| #13 | 582 | 406 | 3140 |
| #14 | 591 | 438 | 2442 |
| #15 | 592 | 449 | 2051 |
| #16 | 571 | 400 | 1639 |
| #17 | 578 | 407 | 1881 |
| #18 | 579 | 410 | 2190 |
| #19 | 595 | 446 | 1736 |
| #20 | 596 | 449 | 1747 |
| #21 | 574 | 400 | 2362 |
| #22 | 582 | 404 | 2889 |
| #23 | 582 | 431 | 2112 |

FIG.4

| SAMPLE | 450nm EXCITATION | 460nm EXCITATION | 470nm EXCITATION |
|---|---|---|---|
| #2 | 577.7 | 578.3 | 579.2 |
| #3 | 580.5 | 580.9 | 581.5 |
| #4 | 581.9 | 582.3 | 582.8 |
| #7 | 578.1 | 578.7 | 579.4 |
| #8 | 580.2 | 580.6 | 581.2 |
| #9 | 581.0 | 581.4 | 582.0 |
| #12 | 577.8 | 578.4 | 579.2 |
| #13 | 580.2 | 580.6 | 581.2 |
| #14 | 583.0 | 583.3 | 583.7 |

FIG.7

| SAMPLE | COMPOSITION DESIGN | | | | MIXTURE COMPOSITION (UNIT : % BY MASS) | | | |
|---|---|---|---|---|---|---|---|---|
| | p (Ca) | q (Eu) | m | n | α-Si$_3$N$_4$ | AlN | CaCO$_3$ | Eu$_2$O$_3$ |
| A | 0.875 | 0.02 | 1.81 | 0.905 | 68.20 | 17.48 | 13.76 | 0.55 |
| B | 0.875 | 0.03 | 1.84 | 0.920 | 67.71 | 17.73 | 13.73 | 0.83 |
| C | 0.875 | 0.04 | 1.87 | 0.935 | 67.23 | 17.98 | 13.69 | 1.10 |
| D | 0.875 | 0.05 | 1.90 | 0.950 | 66.75 | 18.23 | 13.66 | 1.37 |
| E | 0.875 | 0.06 | 1.93 | 0.965 | 66.26 | 18.47 | 13.62 | 1.65 |
| F | 0.875 | 0.07 | 1.96 | 0.980 | 65.78 | 18.71 | 13.59 | 1.91 |
| G | 0.875 | 0.08 | 1.99 | 0.995 | 65.30 | 18.96 | 13.56 | 2.18 |
| H | 0.875 | 0.09 | 2.02 | 1.010 | 64.83 | 19.20 | 13.53 | 2.45 |
| I | 0.875 | 0.10 | 2.05 | 1.025 | 64.36 | 19.44 | 13.50 | 2.71 |
| J | 0.875 | 0.11 | 2.08 | 1.040 | 63.88 | 19.67 | 13.47 | 2.98 |

FIG.8

| SAMPLE | Eu AMOUNT (q) | PEAK INTENSITY RATIO | PEAK WAVE-LENGTH [nm] | DOMINANT WAVE-LENGTH [nm] | CHRO-MATICITY x | CHRO-MATICITY y |
|---|---|---|---|---|---|---|
| A1 | 0.02 | 0.74 | 578.6 | 577.70 | 0.4879 | 0.4924 |
| A2 | | 0.64 | 577.2 | 577.92 | 0.4882 | 0.4899 |
| A3 | | 0.75 | 577.2 | 577.91 | 0.4896 | 0.4914 |
| A4 | | 0.83 | 577.2 | 578.04 | 0.4912 | 0.4914 |
| B1 | 0.03 | 0.82 | 581.2 | 578.64 | 0.4955 | 0.4880 |
| B2 | | 0.99 | 581.0 | 578.87 | 0.4984 | 0.4879 |
| B3 | | 1.07 | 580.2 | 578.88 | 0.4990 | 0.4883 |
| B4 | | 1.04 | 580.8 | 578.86 | 0.4987 | 0.4883 |
| C1 | 0.04 | 0.91 | 583.4 | 579.33 | 0.5009 | 0.4846 |
| C2 | | 0.99 | 584.2 | 579.65 | 0.5038 | 0.4833 |
| C3 | | 1.06 | 580.8 | 579.67 | 0.5043 | 0.4835 |
| C4 | | 1.02 | 580.8 | 579.69 | 0.5043 | 0.4833 |
| D1 | 0.05 | 0.94 | 584.2 | 579.80 | 0.5046 | 0.4822 |
| D2 | | 0.91 | 582.2 | 579.96 | 0.5054 | 0.4810 |
| D3 | | 0.97 | 583.4 | 580.11 | 0.5070 | 0.4806 |
| D4 | | 0.99 | 584.4 | 580.09 | 0.5070 | 0.4808 |
| E1 | 0.06 | 0.88 | 583.6 | 580.13 | 0.5067 | 0.4801 |
| E2 | | 1.03 | 584.0 | 580.37 | 0.5093 | 0.4795 |
| E3 | | 1.04 | 584.8 | 580.24 | 0.5084 | 0.4802 |
| E4 | | 0.99 | 583.8 | 580.33 | 0.5087 | 0.4795 |
| F1 | 0.07 | 0.94 | 585.0 | 580.50 | 0.5097 | 0.4783 |
| F2 | | 0.94 | 585.2 | 580.70 | 0.5110 | 0.4771 |
| F3 | | 0.96 | 585.6 | 580.80 | 0.5121 | 0.4768 |
| F4 | | 1.03 | 584.4 | 580.54 | 0.5106 | 0.4786 |
| G1 | 0.08 | 0.87 | 586.0 | 581.34 | 0.5150 | 0.4730 |
| G2 | | 0.96 | 586.0 | 581.51 | 0.5168 | 0.4725 |
| G3 | | 1.00 | 586.6 | 581.59 | 0.5179 | 0.4724 |
| G4 | | 1.04 | 586.4 | 581.39 | 0.5166 | 0.4736 |
| H1 | 0.09 | 0.91 | 587.4 | 582.01 | 0.5202 | 0.4695 |
| H2 | | 0.88 | 587.0 | 582.04 | 0.5202 | 0.4692 |
| H3 | | 0.97 | 586.6 | 582.00 | 0.5205 | 0.4698 |
| H4 | | 0.87 | 586.6 | 581.96 | 0.5195 | 0.4695 |
| I1 | 0.10 | 0.87 | 588.8 | 582.08 | 0.5204 | 0.4689 |
| I2 | | 0.81 | 587.8 | 582.28 | 0.5211 | 0.4672 |
| I3 | | 0.89 | 587.2 | 582.29 | 0.5222 | 0.4679 |
| I4 | | 0.88 | 587.2 | 582.25 | 0.5218 | 0.4680 |
| J1 | 0.11 | 0.85 | 591.2 | 582.84 | 0.5254 | 0.4643 |
| J2 | | 0.83 | 588.8 | 583.06 | 0.5269 | 0.4630 |
| J3 | | 0.85 | 590.0 | 582.92 | 0.5263 | 0.4640 |
| J4 | | 0.86 | 590.0 | 582.86 | 0.5259 | 0.4644 |

FIG.14

| SAMPLE | COMPOSITION DESIGN | | | | MIXTURE COMPOSITION (UNIT : % BY MASS) | | | |
|---|---|---|---|---|---|---|---|---|
| | p (Ca) | q (Eu) | m | n | $\alpha$-$Si_3N_4$ | AlN | $CaCO_3$ | $Eu_2O_3$ |
| K | 0.82 | 0.07 | 1.85 | 0.925 | 67.46 | 17.79 | 12.83 | 1.92 |
| L | 0.84 | 0.07 | 1.89 | 0.945 | 66.84 | 18.12 | 13.12 | 1.92 |
| M | 0.86 | 0.07 | 1.93 | 0.965 | 66.23 | 18.46 | 13.39 | 1.92 |
| N | 0.88 | 0.07 | 1.97 | 0.985 | 65.62 | 18.80 | 13.67 | 1.91 |
| O | 0.90 | 0.07 | 2.01 | 1.005 | 65.02 | 19.13 | 13.94 | 1.91 |
| P | 0.92 | 0.07 | 2.05 | 1.025 | 64.42 | 19.46 | 14.22 | 1.90 |
| Q | 0.94 | 0.07 | 2.09 | 1.045 | 63.83 | 19.78 | 14.49 | 1.90 |
| R | 0.96 | 0.07 | 2.13 | 1.065 | 63.24 | 20.12 | 14.76 | 1.89 |

FIG.15

| SAMPLE | PEAK INTENSITY RATIO | PEAK WAVE-LENGTH [nm] | DOMINANT WAVE-LENGTH [nm] | CHRO-MATICITY x | CHRO-MATICITY y |
|---|---|---|---|---|---|
| K1 | 0.75 | 583.6 | 580.33 | 0.5067 | 0.4778 |
| K2 | 0.88 | 584.6 | 580.41 | 0.5089 | 0.4787 |
| K3 | 0.91 | 585.6 | 580.67 | 0.5108 | 0.4772 |
| K4 | 0.81 | 585.2 | 580.57 | 0.5095 | 0.4773 |
| L1 | 0.79 | 584.6 | 580.55 | 0.5086 | 0.4768 |
| L2 | 0.92 | 583.6 | 580.72 | 0.5112 | 0.4770 |
| L3 | 0.91 | 585.2 | 580.84 | 0.5119 | 0.4762 |
| L4 | 0.94 | 586.0 | 580.88 | 0.5126 | 0.4763 |
| M1 | 0.69 | 583.8 | 580.34 | 0.5058 | 0.4769 |
| M2 | 0.89 | 585.2 | 580.68 | 0.5107 | 0.4770 |
| M3 | 0.86 | 584.0 | 580.84 | 0.5114 | 0.4758 |
| M4 | 0.83 | 583.4 | 580.85 | 0.5116 | 0.4758 |
| N1 | 0.81 | 583.2 | 580.63 | 0.5093 | 0.4765 |
| N2 | 0.96 | 585.8 | 581.07 | 0.5140 | 0.4752 |
| N3 | 0.99 | 585.0 | 581.16 | 0.5148 | 0.4748 |
| N4 | 0.93 | 585.4 | 581.01 | 0.5135 | 0.4755 |
| O1 | 0.74 | 585.8 | 580.70 | 0.5090 | 0.4754 |
| O2 | 0.84 | 585.2 | 580.79 | 0.5110 | 0.4760 |
| O3 | 0.90 | 584.8 | 580.91 | 0.5124 | 0.4758 |
| O4 | 0.87 | 584.8 | 580.70 | 0.5107 | 0.4768 |
| P1 | 0.74 | 585.4 | 580.71 | 0.5091 | 0.4754 |
| P2 | 0.85 | 584.2 | 580.85 | 0.5113 | 0.4756 |
| P3 | 0.93 | 585.0 | 581.00 | 0.5132 | 0.4754 |
| P4 | 0.91 | 584.4 | 580.82 | 0.5117 | 0.4763 |
| Q1 | 0.75 | 583.8 | 580.71 | 0.5103 | 0.4764 |
| Q2 | 0.90 | 585.6 | 581.10 | 0.5137 | 0.4747 |
| Q3 | 0.93 | 585.8 | 580.99 | 0.5132 | 0.4755 |
| Q4 | 0.94 | 585.6 | 580.86 | 0.5124 | 0.4763 |
| R1 | 0.78 | 585.2 | 580.77 | 0.5099 | 0.4754 |
| R2 | 1.01 | 585.4 | 581.08 | 0.5144 | 0.4754 |
| R3 | 1.00 | 586.6 | 581.28 | 0.5156 | 0.4741 |
| R4 | 0.96 | 585.0 | 581.22 | 0.5149 | 0.4743 |

PHOSPHOR AND AN INCANDESCENT LAMP COLOR LIGHT EMITTING DIODE LAMP USING THE SAME

CROSS REFERENCE TO RELATED APPLICATION

This application claims the benefit of priority under 35 U.S.C. §119 to Japanese Patent Applications No. 2004-206509, filed on Jul. 13, 2004, and Japanese Patent Applications No. 2004-235945, filed on Aug. 13, 2004, the entire content of which is incorporated by reference herein.

BACKGROUND OF THE INVENTION

1. Field of the Invention

The present invention relates to a phosphor and an incandescent lamp color light emitting diode lamp using the same.

2. Description of the Related Art

In a technological field of illumination, a solid-state illumination, specifically, a white light illumination using a semiconductor light emitting diode has attracted a lot of attention and thus researches and developments have been widely and vigorously performed on the lighting apparatus.

A white light emitting diode lamp has attracted a lot of attention as a next generation illumination apparatus that replaces conventional incandescent lamps and fluorescent lamps and thus researches and developments have been carried out vigorously. The white light emitting diode lamp has already acquired a luminous efficacy comparable or superior to that of an incandescent lamp, even though the diode lamp is still in the process of development. In the near future, the white light emitting diode lamp is thought to become widely used as energy-saving illumination equipment.

On top of that, the white light emitting diode lamp has another advantage of being free of substances that impose a heavy burden on the environment such as mercury or the like. Moreover, the diode lamp has so small a size that it is quite often used as a backlight source of a liquid crystal display apparatus or the like and built-in in a cellular phone or the like.

The white light emitting diode utilized in the above white light emitting diode lamp is comprised of a light emitting diode chip that emits a short wavelength light such as blue or the like and a phosphor that is excited by absorbing part or all of the light emitted from the light emitting diode chip and emits a longer wavelength light such as yellow or the like. Thus, white light is obtained by mixing the blue light emitted from the blue light emitting diode as a light source and the yellow light emitted from the phosphor.

As an example of such a diode, there has been a white light emitting diode composed of a compound semiconductor blue light emitting diode chip and a cerium-activated Yttrium Aluminium Garnet (YAG) phosphor that absorbs blue light and emits yellow light, which is a complementary color of blue (See, for example, Japanese Patent Publications No. 2900928, 2927279, 3364229, U.S. Pat. Nos. 5,998,925, 6,069,440, 6,614,179, 6,592,780, S. Nakamura, "Present Performance of InGaN based blue/green/yellow LEDs," Proc. SPIE 3002, pp. 26-35 (1997), and "Development of High-bright and Pure-white LED Lamps", K. Bando, K. Sakano, Y. Noguchi and Y. Shimizu, J. Light & Vis. Env. Vol. 22, No. 1 (1998), pp. 2-5).

The white light emitting diode utilizing the YAG phosphor is disadvantageous in that it is difficult to improve color rendering thereof due to a deficiency of red component and to realize a low color temperature white light such as an incandescent lamp color light.

In order to eliminate such a disadvantage, there exists a technology that enables a white light emitting diode lamp by mixing two phosphors including a phosphor that emits red light (See, for example, Japanese Patent Application Laid-open Publications Nos. 2003-273409 and 2003-321675, U.S. Pat. No. 6,680,569, and R. Mueller-Mach, G. O. Mueller, M. R. Krames and T. Trottier, IEEE J. Selected Topics Quantum Electron., Vol. 8, No. 2, pp. 339-345 (2002), M. Yamada, T. Naitou, K. Izuno, H. Tamaki, Y. Murazaki, M. Kameshima and T. Mukai, Jpn. J. Appl. Phys., Vol. 42 (2003) pp. L20-L23.

In addition, in recent years, an oxynitride phosphor and a nitride phosphor are now paid attention to as a phosphor having higher reliabilities and a longer lifetime than a conventional sulfide phosphor and an oxide phosphor (See, for example, R. J. Xie, M. Mitomo, K. Uheda, F. F. Xu and Y. Akimune, J. Am. Ceram. Soc., 85[5] 1229-1234 (2002)).

Among them, an europium-activated Ca-α-SiAlON phosphor that has been originally developed as a high temperature and high strength material is promising as a phosphor for a white light emitting diode (See, for example, Japanese Patent Application Laid-open Publications No. 2002-363554, 2003-336059, 2003-124527, 2004-067837, U.S. Pat. No. 6,632,379, U.S. Patent Application Publication No. 2003/0168643, U.S. Pat. No. 6,657,379, R. J. Xie, M. Mitomo, K. Uheda, F. F. Xu and Y. Akimune, J. Am. Ceram. Soc., 85 [5] 1229-1234 (2002), J. W. H. van Krevel, J. W. T. van Rutten, H. Mandal, H. T. Hintzen, and R. Metselaar, J. Solid State Chem., 165, 19-24 (2002), G. Z. Cao and R. Metselaar, Chem. Mater., 1991, 3, 242-252, Z. J. Shen, M. Nygren, and U. Halenius, J. Mater. Sci. Lett., 16, pp. 263-266 (1997), Joost Willem Hendrik van Krevel, "On new rare-earth doped M-Si—Al—O—N materials: Luminescence Properties and oxidation resistance,", Technische Universiteit Eindhoven, 2000, ISBN 90-386-2711-4, H. Mandal and M. J. Hoffmann, "Preparation of Multiple-Cation α-SiAlON Ceramics Containing Lanthanum," J. Am. Ceram. Soc., 82 [1] 229-32 (1999)).

By the way, light color classification (chromaticity range) of fluorescent lamps is defined in Japanese Industrial Standard (JIS) Z 9112-1990, "Classification of Fluorescent Lamps by Chromaticity and Colour Rendering Property". Incandescent lamp color is based on the classification defined therein.

In addition, chromaticity range of light from a 2700 K lamp as a light source having a low color temperature is defined in ANSI C78.376-2001, "Specifications for the Chromaticity of Fluorescent Lamps," American National Standards Lighting Group—National Electrical Manufacturers Association.

SUMMARY OF THE INVENTION

However, conventional general illumination apparatuses of various types have a problem of waste disposal since they contain substances that impose a heavy burden on the environment such as mercury or the like and require an improved power efficiency.

While a semiconductor illumination apparatus, specifically, a white light emitting diode lamp is expected to solve such problems, the white light emitting diode lamp in a mainstream that is composed of a blue light emitting diode and a Ce-activated YAG phosphor cannot emit a low color temperature light such as incandescent lamp color due to a deficiency of red component of the spectrum. Thus, an increasing demand for an illumination apparatus that emits low color temperature light cannot be satisfied.

As a measure to solve the above disadvantage, a mixing of a red phosphor with phosphor for use in the white light emitting diode can be cited. However, there has not exited an appropriate red phosphor having a high light intensity. That is, use of an existing red phosphor leads to a reduced conversion efficiency of light.

In addition, in order to realize a low color temperature light, a large amount of the above phosphor that is inferior in light emitting efficiency is needed to be mixed, thereby leading to a reduced light emitting efficiency as above mentioned and a reduced transmissivity of light emitting through a resin with the phosphor dispersed, the resin being used to fabricate a white light emitting diode lamp.

Moreover, a large overlap of an excitation wavelength range of phosphor in longer wavelengths and an emission wavelength range of the phosphor in shorter wavelengths results in an emission loss.

Furthermore, in the conventional sulfide phosphor and oxide phosphor, a temperature stability in chromaticity and emission intensity is not sufficient and thus further improvement has been required.

As a promising phosphor that satisfies the above requirements, is harmless, has high reliabilities, and realizes high emission intensity, there is an oxynitride phosphor and a nitride phosphor. Among them, α-SiAlON is particularly promising (See, for example, Japanese Patent Application Laid-open Publication No. 2002-363554).

However, these materials are still under development or at the early stage of investigation toward practical use. Further researches and developments are required in order to realize a practically usable white light emitting diode lamp using such phosphors.

For example, the aforementioned Japanese Patent Application Laid-open Publication No. 2002-363554 has disclosed a wavelength of the light emitted therefrom shifts in accordance with a concentration of Eu along with that a composition range in which an α-SiAlON can be synthesized. At the same time, the publication describes that emission intensity varies largely depending on a change in Eu concentration. Therefore, choosing an appropriate emission wavelength cannot be achieved concurrently with realizing a high emission intensity.

Japanese Patent Application Laid-open Publication No. 2003-124527 discloses that a phosphor obtained by substituting 1 to 10% of Ca in a composition of $Ca_{1.5}Al_3Si_9N_{16}$ with $Eu^{2+}$ has a high quantum efficiency and the emission peak wavelength shifts by a range of from 580 to 590 nm due to the substitution. The publication also discloses that a phosphor obtained by substituting 10 to 15% of Ca in a composition of $CaSi_{10}Al_2N_{16}$ with $Eu^{2+}$ has a high quantum efficiency and the emission wavelength shifts toward shorter wavelengths.

However, the SiAlON phosphor disclosed by Japanese Patent Application Laid-open Publication No. 2003-124527 needs further improvement in emission intensity in order to be applied by itself in a white light emitting diode for use in general illumination. In addition, the publication describes a white light emitting diode while placing a focus on an instance in which the phosphor is mixed with other known oxide phosphors in order to adjust chromaticity of the light therefrom.

Technologies disclosed in other patent and non-patent documents are still under way of development. Also, those documents have not yet disclosed any detailed technical information that makes it possible to determine a composition of the α-SiAlON for use in a white light emitting diode lamp based upon the requirements thereof.

Therefore, an improvement in emission intensity through further detailed studies and technology for fine adjusting an emission wavelength are required.

In order to realize an enhanced efficiency in such a wavelength conversion type white light emitting diode, not only a blue light emitting diode chip as a light source but also the conversion efficiency of a phosphor needs to be improved. While the α-SiAlON is suitable for use in the white light emitting diode of this type, still further improvement in emission intensity has been desired.

In summary, in a technological field of a solid illumination apparatus that is superior in power efficiency and free from substances that impose a heavy burden on environment, an incandescent lamp color light emitting diode lamp having high efficiency, thermally stable chromaticity, and low temperature color needs to be realized by further improving emission intensity of known α-SiAlON and establishing the technology of fine adjustment of its emission wavelength.

The objective of the present invention is to provide a phosphor that is able to emit a low color temperature light when applied in a light emitting diode lamp. Another objective of the present invention is to provide an incandescent lamp color light emitting device that has a low environmental burden and a high emission intensity, and emits incandescent lamp color light having low color temperature by using the phosphor.

In order to achieve the above objective, a first aspect of the present invention provides a phosphor represented by a general formula of $M_p(Si, Al)_{12}(O, N)_{16}:Eu^{2+}_q$, wherein a main phase thereof is an α-SiAlON phosphor having an α-SiAlON structure and the p is from 0.75 to 1.0 while said q is between 0.02 and 0.09. The M is at least one element of Ca, Y, Mg, Li, Sc, Pr, Nd, Pm, Sm, Gd, Tb, Dy, Ho, Er, Tm, Yb, Lu, and Sr.

A second aspect of the present invention provides a phosphor according to the first aspect, wherein the p is from 0.03 to 0.08 in the formula. This range results in a specifically excellent property.

A third aspect of the present invention provides a phosphor according to the first aspect, wherein the M includes at least one of Ca and Y.

A fourth aspect of the present invention provides a phosphor recited in any one of the first to the third aspect, wherein a ratio of Si to Al and a ratio of O to N in the α-SiAlON phosphor are represented by a general formula of $M2_jM3_kSi_{12-(m+n)}Al_{(m+n)}O_nN_{16-n}$, where the M2 is a divalent cation and the M3 is a trivalent cation. Here, $(2 \times j + 3 \times k)$ is designated to m, and $(2 \times j + 3 \times k)/2$ is designated to n.

A fifth aspect of the present invention provides a phosphor according to any one of the first to the fourth aspect, wherein the phosphor is obtained by wet-mixing starting materials, drying the mixed materials, granulating aggregate having a predetermined particle size, charging the granulated materials that remain in power form of powder density of equal to or less than 20% into a sintering furnace, and sintering the materials under a nitrogen atmosphere.

A sixth aspect of the present invention provides a phosphor according to the fifth aspect, wherein aggregates having a particle size of 45 micrometers or smaller are sorted. The powdery phosphor having a particle size of 45 micrometers or smaller can be dispersed into a resin. In addition, the phosphor is powdery preferably having a particle size of 20 micrometers or smaller. Furthermore, a ratio of the phosphor powders having a particle size of 2 micrometers or smaller to the whole amount is 10% or less.

A seventh aspect of the present invention provides a phosphor according to the fifth and the sixth aspect, wherein the phosphor is gas-pressure-sintered under a nitrogen pressure of 2 atoms or more.

An eighth aspect of the present invention provides a phosphor according to any one of the fifth to the seventh aspect, wherein the phosphor is sintered at a temperature of from 1650 degrees Celsius to 1750 degrees Celsius.

A ninth aspect of the present invention provides a phosphor according to the eighth aspect, wherein the phosphor is sintered by retaining said temperature for 20 hours or more.

A tenth aspect of the present invention provides a phosphor according to any one of the fifth aspect to the ninth aspect, wherein the phosphor is obtained by mixing starting materials including Silicon Nitride powder, Calcium Carbonate powder, Aluminum Nitride powder, and Europium Oxide powder.

An eleventh aspect of the present invention provides a phosphor according to any one of the fifth to the tenth aspect, wherein the phosphor is obtained by mixing with n-hexane as a solvent.

A twelfth aspect of the present invention provides a phosphor according to any one of the fifth to the eleventh aspect, wherein the α-SiAlON phosphor is charged into a container with a cover and sintered in a sintering furnace while kept in the container with a cover.

A thirteenth aspect of the present invention provides an incandescent lamp color light emitting diode lamp comprising a semiconductor blue light emitting diode chip having a center emission wavelength in a range of from 400 nm to 480 nm, and an α-SiAlON phosphor that absorbs part of the light emitted from said semiconductor blue light emitting diode chip and emits light having a different wavelength from the light emitted from the diode chip. In this light emitting diode lamp, the α-SiAlON phosphor is a phosphor according to any one of the first to the twelfth aspect. The light emitting diode lamp emits light having an emission color produced by a mixture of the light emitted from the semiconductor blue light emitting diode lamp and the light emitted from the above α-SiAlON phosphor. The chromaticity range is in an incandescent lamp color area in the XYZ chromaticity diagram, the area being represented by a tetragon defined by chromaticity coordinates (x, y) of (0.4775, 0.4283), (0.4594, 0.3971), (0.4348, 0.4185), and (0.4214, 0.3887) on the diagram.

By the way, the center emission wavelength of the above semiconductor blue light emitting diode chip is preferably in a range of from 430 nm to 470 nm. Moreover, the center emission wavelength may be in a range of from 433 nm to 462 nm.

A fourteenth aspect of the present invention provides an incandescent lamp color light emitting diode lamp according to the thirteenth aspect, wherein the q is in a range of from 0.03 to 0.07 in the formula.

A fifteenth aspect of the present invention provides an incandescent lamp color light emitting diode lamp according to the fourteenth aspect further comprising a resin that covers the above semiconductor blue light emitting diode lamp, wherein the above α-SiAlON phosphor is powdery having a gain size of 45 micrometers or smaller and dispersed in the resin.

A sixteenth aspect of the present invention provides an incandescent lamp color light emitting diode lamp according to the fifteenth aspect, wherein the α-SiAlON phosphor is powdery having a particle size of 20 micrometers or smaller.

A seventeenth aspect of the present invention provides an incandescent lamp color light emitting diode lamp according to the sixteenth aspect, wherein a ratio of the α-SiAlON phosphor powders having a particle size of 2 micrometers or smaller to the whole amount is 10% or less.

Furthermore, another aspect of the present invention can provide a light emitting device having a semiconductor light source chip and a wavelength conversion material, wherein the main phase of wavelength conversion material has an α-SiAlON structure that is represented by a general formula of $Ca_p(Si, Al)_{12}(O, N)_{16}:Eu^{2+}_q$, and wherein the p is from 0.75 to 1.0 and the q is between 0.02 and 0.09.

By using α-SiAlON phosphor as a wavelength conversion material, the light emitting device having a far higher emission intensity can be realized. When q is from 0.03 to 0.07 in the formula, especially excellent properties are obtained.

In addition, it is more preferable that the above semiconductor chip is a semiconductor light emitting diode chip and the above light emitting device is a white light emitting diode lamp for general illumination purposes.

According to the present invention, there is provided an incandescent lamp color light emitting diode lamp that has a high emission efficiency and an appropriate chromaticity. In addition, there is provided a phosphor that enables a phosphor that has an improved wavelength conversion efficiency and an improved emission intensity. Further, by using this phosphor, there is provided a light emitting device that has a light emitting device that has a higher brightness.

BRIEF DESCRIPTION OF THE DRAWINGS

In the drawings:

FIG. 1 is a table summarizing composition design and mass ratios of starting materials for an α-SiAlON phosphor.

FIG. 2 is a table summarizing results of optical properties measurement carried out for each sample listed in FIG. 1.

FIG. 4 is a table summarizing dominant wavelengths in each excitation wavelength for the primary samples listed in FIG. 1.

FIG. 7 is a table summarizing composition design and mass ratios of starting materials for the α-SiAlON phosphor.

FIG. 8 is a table summarizing results of optical properties measurement for each sample listed in FIG. 7.

FIG. 14 is a table summarizing composition design and mass ratio of starting materials for an α-SiAlON phosphor used in a third experiment.

FIG. 15 is a table summarizing results of optical properties measurements of the α-SiAlON phosphor used in the third experiment.

DESCRIPTION OF THE PREFERRED EMBODIMENTS

Figure 3:
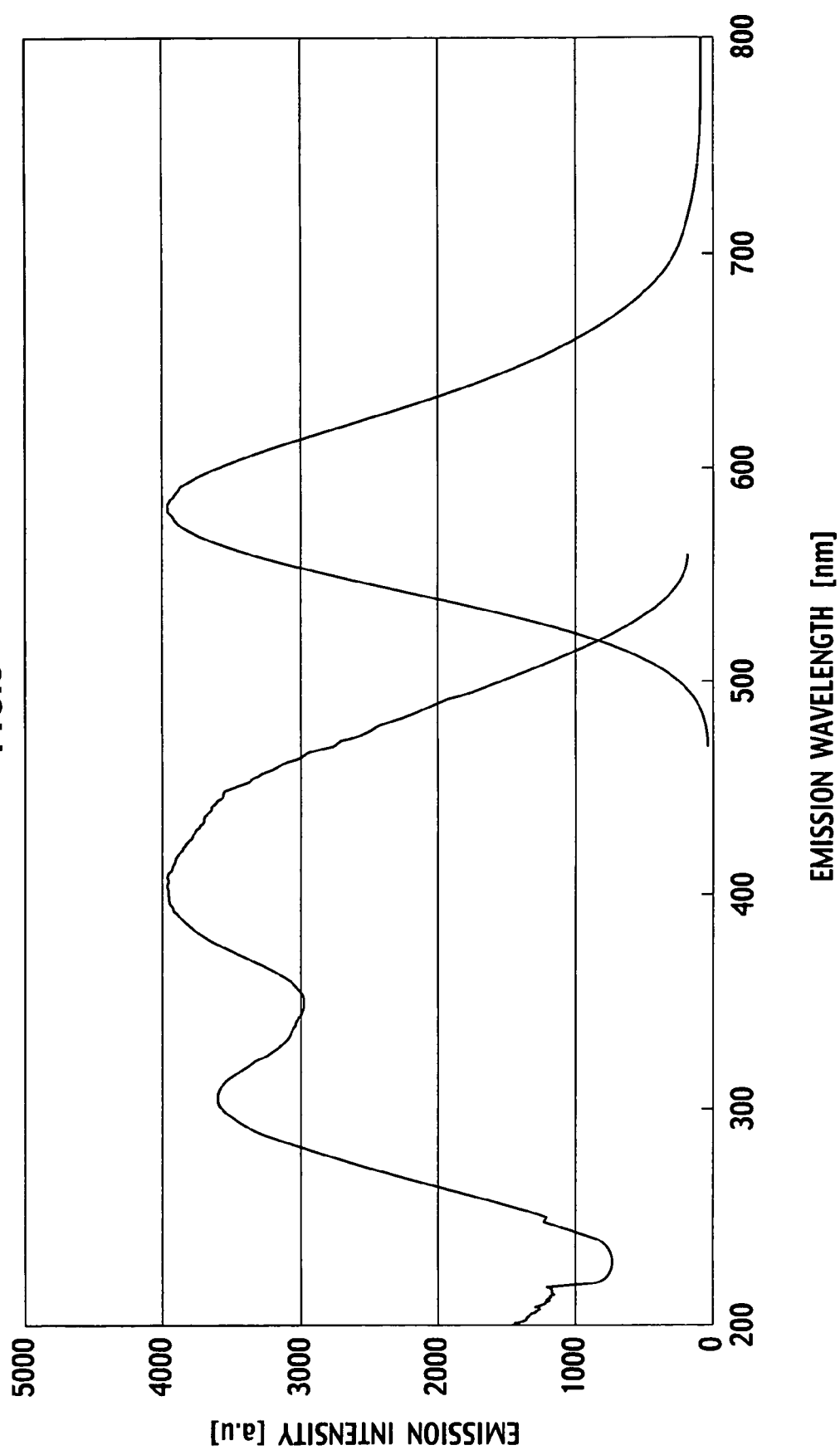
FIG. 3 illustrates excitation and emission spectra of a sample 3 in FIG. 1.

Referring to accompanying drawings, phosphor and an incandescent lamp color light emitting diode lamp according to preferred embodiments of the present invention will be described hereinafter.

While the present invention relates to an incandescent lamp color light emitting diode having a high emission efficiency and an appropriate chromaticity, such a light emitting diode is based on the phosphor according to the present invention. Therefore, before describing the incandescent lamp color light emitting diode, the phosphor according to the present invention will be described in detail.

The inventors of the present invention have devotedly conducted researches and developments on divalent Eu-activated α-SiAlON phosphor having a chromaticity belonging to yellow, yellow red, or orange preferable for use in a combination with a blue light emitting diode, on a basis of disclosed technical information. As a result, they have obtained a great deal of novel knowledge leading to the present invention. The α-SiAlON phosphor and the blue light emitting diode will be detailed hereinafter.

<1. Phosphor Composition-1->

Japanese Patent Application Laid-open Publication No. 2002-363554 discloses a phosphor of which composition is represented by a general formula of $Me_pSi_{12-(m+n)}Al_{(m+n)}O_nN_{16-n}$. Me is Ca, Mg, Y, and lanthanide metals except for La and Ce; lanthanide metals as an emission center such as Ce, Pr, Eu, Tb, Yb, and Er that substitute part of Me; and Dy as their co-activator, according to the publication. When the metal Me is divalent, m is in a range of $0.6<m<3.0$ and n is in a range of $0 \leqq n<1.5$, while when the metal Me is trivalent, m is in a range of $0.9<m<4.5$ and n is in a range of $0 \leqq n<1.5$ as disclosed in the publication. The lanthanide metals are 15 elements of La, Ce, Pr, Nd, Pm, Sm, Eu, Gd, Tb, Dy, Ho, Er, Tm, Yb, and Lu.

Japanese Patent Application Laid-open Publication No. 2003-124527 disclose a phosphor of which composition is represented by a general formula of $M_{m/2}Si_{12-(m+n)}Al_{(m+n)}O_nN_{16-n}:Eu^{2+}$. M is Ca only, or a combination of Ca with either of Sr or Mg. n is in a range between 0 and 2.5 and m is in a range between 0.5 and 3.

Japanese Patent Application Laid-open Publication No. 2004-067837 discloses a phosphor having a composition of a general formula of $Me_pSi_{12-(m+n)}Al_{(m+n)}O_nN_{16-n}$. M is Li, Mg, Ca, Y, or rare-earth metals except for La and Ce, and m/n is in a range of $1.8 \leqq m/n \leqq 2.2$. Rare-earth metals are 17 elements of Sc, Y, and the aforementioned lanthanide metals.

R. J. Xie et al. describe an α-SiAlON solid solution containing Eu, Tb, or Pr along with Ca in R. J. Xie, M. Mitomo, K. Uheda, F. F. Xu and Y. Akimune, J. Am. Ceram. Soc., 5[5]1229-1234 (2002).

In addition, Joost Willem Hendrik van Krevel describe an α-SiAlON solid solution containing Tb, Ce, or Eu along with Ca or Y in Joost Willem Hendrik van Krevel, "On new rare-earth doped M-Si—Al—O—N materials: Luminescence Properties and oxidation resistance," Technische Universiteit Eindhoven, 2000, ISBN 90-386-2711-4.

Z. J. Shen et al. describe an α-SiAlON solid solution containing Nd, Sm, Tb, Dy, Er, Yb, and Y. Also, Z. J. Shen et al. describes that an oxynitride crystal solid solution containing α-SiAlON phase and Eu in Z. J. Shen, M. Nygren, and U. Halenius, J. Mater. Sci. Lett., 16, pp. 263-66 (1997).

H. Mandal et al. describe that La can be accommodated into α-SiAlON when Ca or Y is co-doped in H. Mandal and M. J. Hoffmann, "Preparation of Multiple-Cation α-SiAlON Ceramics Containing Lanthanum," J. Am. Ceram. Soc., 82[1] 229-232 (1999).

An α-SiAlON suitable for a white light emitting diode emitting low color temperature light can be synthesized by doping divalent Eu to the α-SiAlON that can be synthesized in the above composition range.

Next, a ratio of dopant elements will be described. α-SiAlON has a structure in which part of Si—N bonds of α-SiAlON type silicon nitride is substituted with Al—N bonds or Al—O bonds and is stabilized by interstitial metal elements. Eu that serves as an emission center cannot be accommodated into α-SiAlON alone, but an oxynitride phosphor of a single phase of α-SiAlON structure can be composed when Eu is doped with co-dopant metal Ca. An amount of various metals to be doped and an amount of rare earths to activate as an emission center will be described within a composition range of which α-SiAlON can be synthesized.

In comparing with prior art, a range of compositions p and q in the general formula $Ca_p(Si, Al)_{12}(O, N)_{16}:Eu^{2+}_q$ will be discussed hereinafter, assuming that the metal to be solid-soluted is Ca only and an activator element is Eu only.

By the way, a composition range disclosed in Japanese Patent Application Laid-open Publication No. 2002-363554 corresponds to $0.3<p+q<0.75$ and $0.01<q<0.7$. A composition range disclosed in Japanese Patent Application Laid-open Publication No. 2003-336059 corresponds to $0.05<p+q<0.3$, $0.02<p<0.27$, and $0.03<q<0.3$. In addition, a range of the amount p disclosed in Japanese Patent Application Laid-open Publication No. 2003-124527 corresponds to 0.25 to 1.5, specifically 1 to 1.5. However, this Publication No. 2003-124527 does not disclose an amount of q.

Japanese Patent Application Laid-open Publication No. 2003-124527 describes substitution of Eu for 1 to 10% of Ca in $Ca_{1.5}Si_9Al_3N_{16}$, the composition of which corresponds to p+q=1.5 and $0.015 \leq q \leq 0.15$.

There is disclosed another example in which Eu is substituted for 10 to 15 mol % of Ca in $CaSi_{10}Al_2N_{16}$, the composition of which corresponds to p+q=1 and $0.1 \leq q \leq 0.25$, specifically, $0.1 \leq q \leq 0.15$.

A composition range disclosed in Japanese Patent Application Laid-open Publication No. 2004-067837 corresponds to $0.15 \leq p+q \leq 1.5$, specifically, $0.30 \leq p+q \leq 0.75$ and $0.015 \leq q \leq 0.3$.

In contrast to the above-mentioned prior art, the inventors of the present invention have investigated an amount p of a metal element and an amount q of Eu as an activator, adopting a different synthesizing process.

In a first experiment, an α-SiAlON phosphor having a composition in the following wide range was synthesized and optical properties thereof were measured. The α-SiAlON is $Eu^{2+}$-activated Ca-α-SiAlON represented by a general formula of $Ca_pSi_{12-(m+n)}Al_{(m+n)}O_nN_{16-n}:Eu^{2+}_q$ or $Ca_p(Si, Al)_{12}(O, N)_{16}:Eu^{2+}_q$. A main phase thereof is an α-SiAlON crystal structure.

In the first experiment, twenty three samples having various compositions and the other many samples have been synthesized and their optical properties have been evaluated.

Next, composition designing will be described. First, a value of p representing Ca content and a value of q representing Eu content in the formula of $Ca_pSi_{12-(m+n)}Al_{(m+n)}O_nN_{16-n}:Eu^{2+}_q$ is determined. These values are set as those listed for each of the samples 1 to 23 in FIG. 1. Next, "2p+3q" and "(2p+3q)/2" are defined as m and n, respectively. When designing a composition, Eu is assumed to be trivalent since $Eu_2O_3$ is used as a starting material. However, since Eu can be reduced to be divalent during sintering, the values of m and n are potentially slightly different than designed.

Next, a synthesizing method of α-SiAlON phosphor will be described.

As starting materials, α-Silicon Nitride (α-$Si_3N_4$), Aluminum Nitride (AlN), Calcium Carbonate ($CaCO_3$), and Europium Oxide ($Eu_2O_3$) were used.

Mass ratios of these starting materials calculated in accordance with the above composition designing are summarized in FIG. 1. Then, the starting materials in powder form were weighed in accordance with the ratio and mixed. When mixing, a predetermined amount of n-hexane was added to the weighed materials and then the n-hexane-added materials were well mixed by a planetary ball mill for 2 hours.

The mixed materials were dried by a rotary evaporator and then the dried materials were pounded well in a mortar. Then, the pounded materials were charged into a covered container made of Boron Nitride.

Then, the sintering process was carried out for the pounded materials at a temperature of 1600 degrees Celsius in a 0.1 MPa Nitrogen atmosphere for about 8 hours. Since the pounded materials were solidified into a mass after the materials were unloaded from the sintering apparatus, the mass was then crushed into powder with an application of only a little force.

Excitation and emission spectra of the powder phosphor samples of 23 types that had been synthesized as described above were measured using a fluorescence spectrophotometer.

FIG. 2 illustrates a result of the measurement carried out using a fluorescence spectrophotometer. As illustrated in FIG. 2, this α-SiAlON phosphor turns out be an excellent phosphor exhibiting a high emission intensity in a wide composition range. Specifically, it has been found that the α-SiAlON phosphor exhibits especially excellent properties in a composition range of $0.75 \leq p \leq 1.0$ and $0.04 \leq q \leq 0.25$.

FIG. 3 illustrates excitation and emission spectra of the sample 3, the spectra having been measured using a fluorescence spectrophotometer. By the way, the emission monitoring wavelength when measuring the excitation spectrum and the excitation wavelength when measuring the emission spectrum were as those in FIG. 2, that is, 582 nm and 410 nm, respectively.

This phosphor is suitable for various types of light emitting apparatuses or display apparatuses. Specifically, the phosphor is suitable as a wavelength conversion material for use in a white light emitting diode lamp for general illumination.

The white light emitting diode lamp is categorized into a near-ultraviolet excitation type and a blue excitation type. The latter will be described hereinafter as an example of the white light emitting diode lamp, the type being now in a mainstream of a white light emitting diode lamp.

The white light emitting diode lamp of blue excitation type uses a semiconductor blue light emitting diode chip that emits light having a wavelength of from 400 nm to 480 nm and a phosphor that is excited by the light emitted from the diode chip and emits yellow light, which is a complementary color of blue. Specifically, a blue light emitting diode chip that emits light having a wavelength of from 450 nm to 470 nm is preferably used, since such a chip having excellent properties is commercially available.

Figure 5:
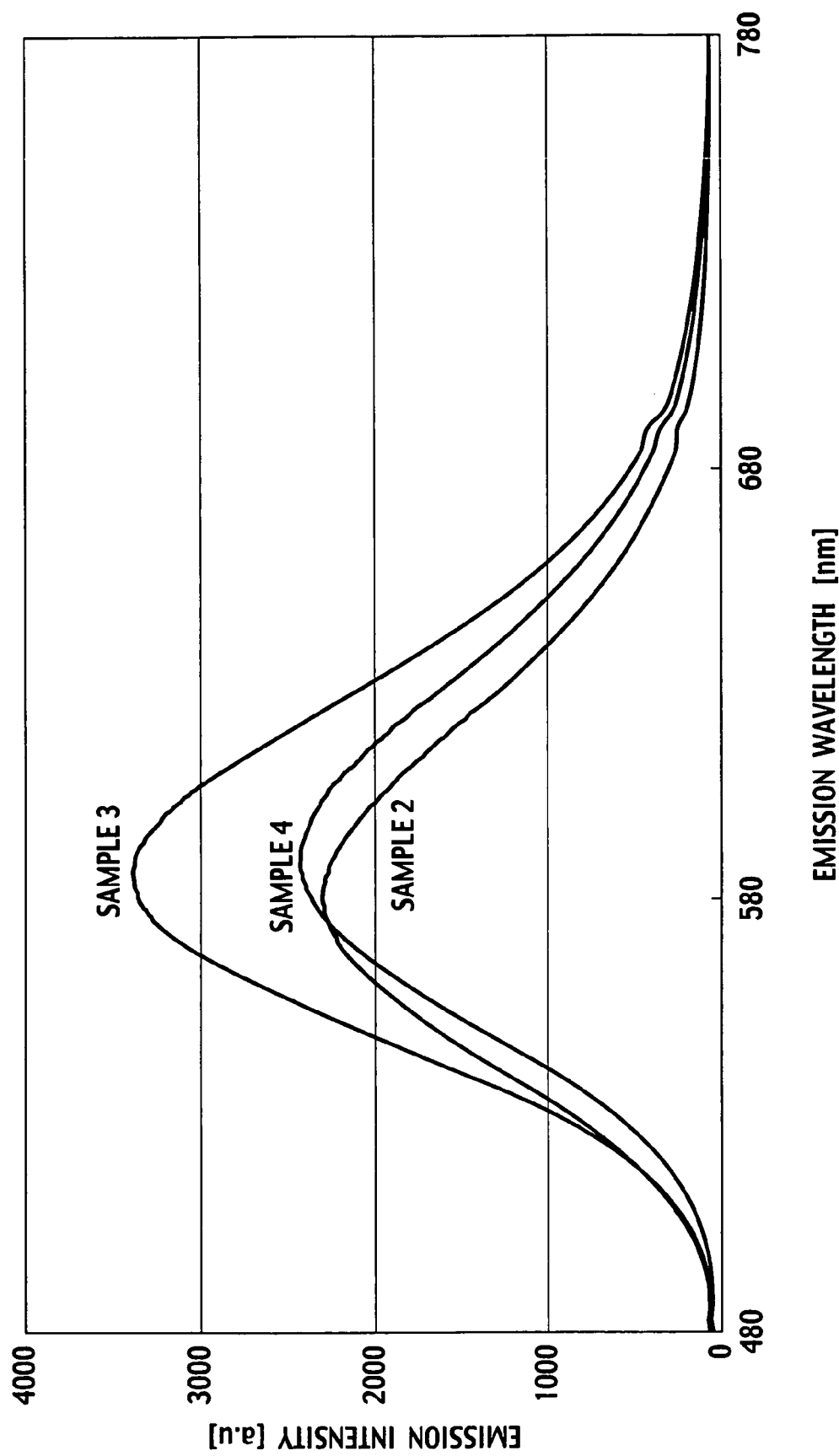
FIG. 5 illustrates emission spectra of the primary samples measured with an excitation wavelength of 460 nm.
Figure 6:
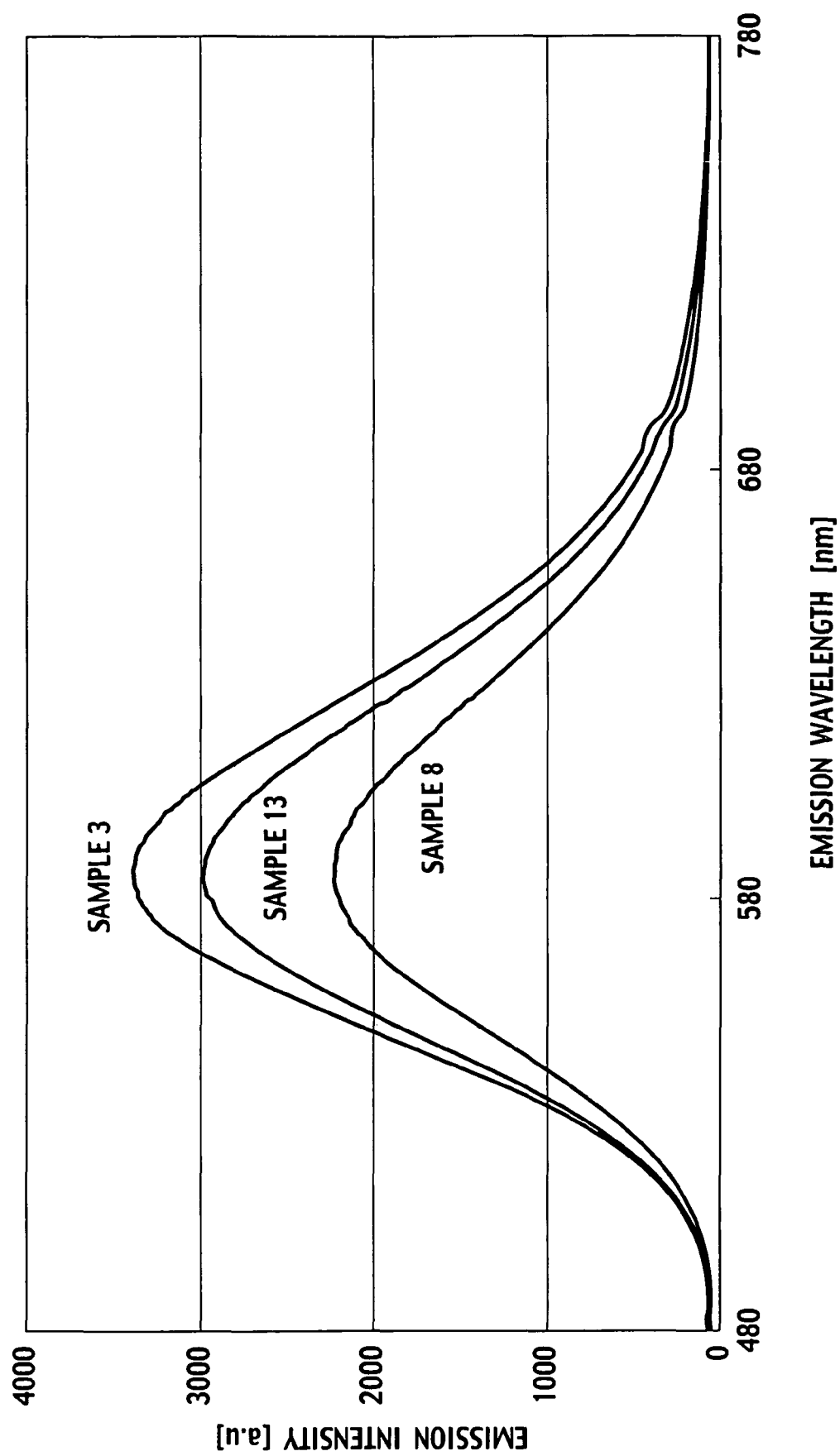
FIG. 6 illustrates emission spectra of the primary samples measured with an excitation wavelength of 460 nm.

FIG. 4 lists dominant wavelengths of the samples having an extremely high emission intensity when being excited by light having a wavelength of 450 nm, 460 nm, and 470 nm as illustrated in FIG. 2. In addition, FIGS. 5 and 6 illustrate emission spectra of several samples when being excited with an excitation wavelength of 460 nm. From these measurement results illustrated, this phosphor is preferable for use in a white light emitting diode of blue excitation type.

By the way, as apparent from the excitation spectra in FIG. 3, this phosphor can be efficiently excited also by ultraviolet light and thus can be utilized as a yellow light emitting material for a white light emitting diode of near-ultraviolet excitation type when mixed with other phosphors.

In a second experiment, a further investigation was carried out with a view toward further improvements in emission intensity and controllability in emission wavelength after a slight modification for the better in a phosphor preparation process. By the way, the modification in the process will be described later.

Starting materials for the above α-SiAlON phosphor are α-Silicon Nitride (α-$Si_3N_4$), Aluminum Nitride (AlN), Calcium Carbonate ($CaCO_3$), and Europium Oxide ($Eu_2O_3$) as described above. Regarding the composition designing, firstly, a value of p representing Ca content and a value of q representing Eu content in the formula of $Ca_pSi_{12-(m+n)}Al_{(m+n)}O_nN_{16-n}:Eu^{2+}_q$ is determined. Then, "2p+3q" and "(2p+3q)/2" are defined as m and n, respectively. When designing a composition, Eu is assumed to be trivalent since $Eu_2O_3$ is used as its starting material. However, since Eu can be reduced to be divalent in the sintered materials, the values of m and n are potentially slightly different than designed. FIG. 7 summarizes the composition designing, a mass ratio calculated in accordance therewith, and the above-defined values of m and n.

In accordance with the mass ratio in FIG. 7, the starting materials in powder form were weighed and mixed. When mixing, a predetermined amount of n-hexane was added to the weighed materials and then the n-hexane-added materials were well mixed by a planetary ball mill for 2 hours. The mixed materials were dried by a rotary evaporator and then the dried materials were pounded well in a mortar. Next, the pounded materials were granulated using a stainless steel test sieve having an aperture size of 63 or 125 micrometers to obtain powdered materials having a corresponding particle diameter, which were then charged into a covered container made of Boron Nitride. In this case, four containers for each sample are used. The samples each charged into a respective container are designated as A1, A2, A3, and A4. Here, "1" means that the sample designated as above was granulated to 63 micrometers and '2' to "4" mean that the samples to 125 micrometers. By the way, a particle size of the aggregated materials when they are granulated scarcely changes before and after the sintering.

The sintering process was carried out for the powder materials at a temperature of 1,700 degrees Celsius in a 1.0 MPa Nitrogen atmosphere for 8 hours. Since the powdered materials were solidified into a mass when they are unloaded from a sintering apparatus, the mass was then crushed into powder with an application of a little force in a mortar. In this case, since there is a slight difference in force required to crush the samples, a rather strong force has to be applied using a pestle and mortar depending on the samples.

By the way, there are concerns about a reduction in emission intensity of the powder phosphor because crystallinity may slightly deteriorate in a surface or its vicinities of a micro particle of the powder depending on a degree of force applied for crushing the mass. Manual procedures of crushing the mass into a phosphor sample are thought to be one of the causes that vary the emission intensity of each sample.

As described above, 40 samples of 10 types of powder α-SiAlON phosphors were synthesized. Namely, ten numbers of q's (the samples A to J) were chosen from a range of from 0.02 to 0.11, and thus 4 samples for each composition q were synthesized. Excitation spectra of the 40 powder phosphor samples were measured using a fluorescence spectrophotometer. When carrying out the measurements, a fluorescence spectrophotometer (HITACHI F-4500) was used. For the fluorescence spectrophotometer, spectrum correction was conducted using Rhodamine B and a vendor-provided standard light source.

For these 40 samples, emission spectra were measured using the fluorescence spectrophotometer. The excitation wavelength for the measurements was 450 nm assuming that a blue light emitting diode chip is used for excitation. In addition, as a standard phosphor sample for comparison, P46-Y3 phosphor, which has been known of as a typical example of $Ce^{3+}$-activated Yttrium Aluminum Garnet phosphor, was used. Emission intensities of each sample at their peak emission wavelength were obtained by normalizing with reference to the emission intensity at 568 nm of the standard phosphor that was excited by light having a wavelength of 460 nm.

By the way, in fluorescence spectroscopy measurements, the emission intensity, that is, the vertical axis of a graph of the emission spectrum obtained is taken as arbitrary unit. Although it is generally difficult to compare emission intensities at different wavelengths, it should be noted that a comparison in accordance with the data in FIG. 8 can justify an emission intensity relation, because the data were obtained by using the fluorescence spectrophotometer for which the spectrum correction was conducted, the emission spectrum of each sample is rather broad, and the peak emission wavelength is not largely different between the samples.

Figure 9:
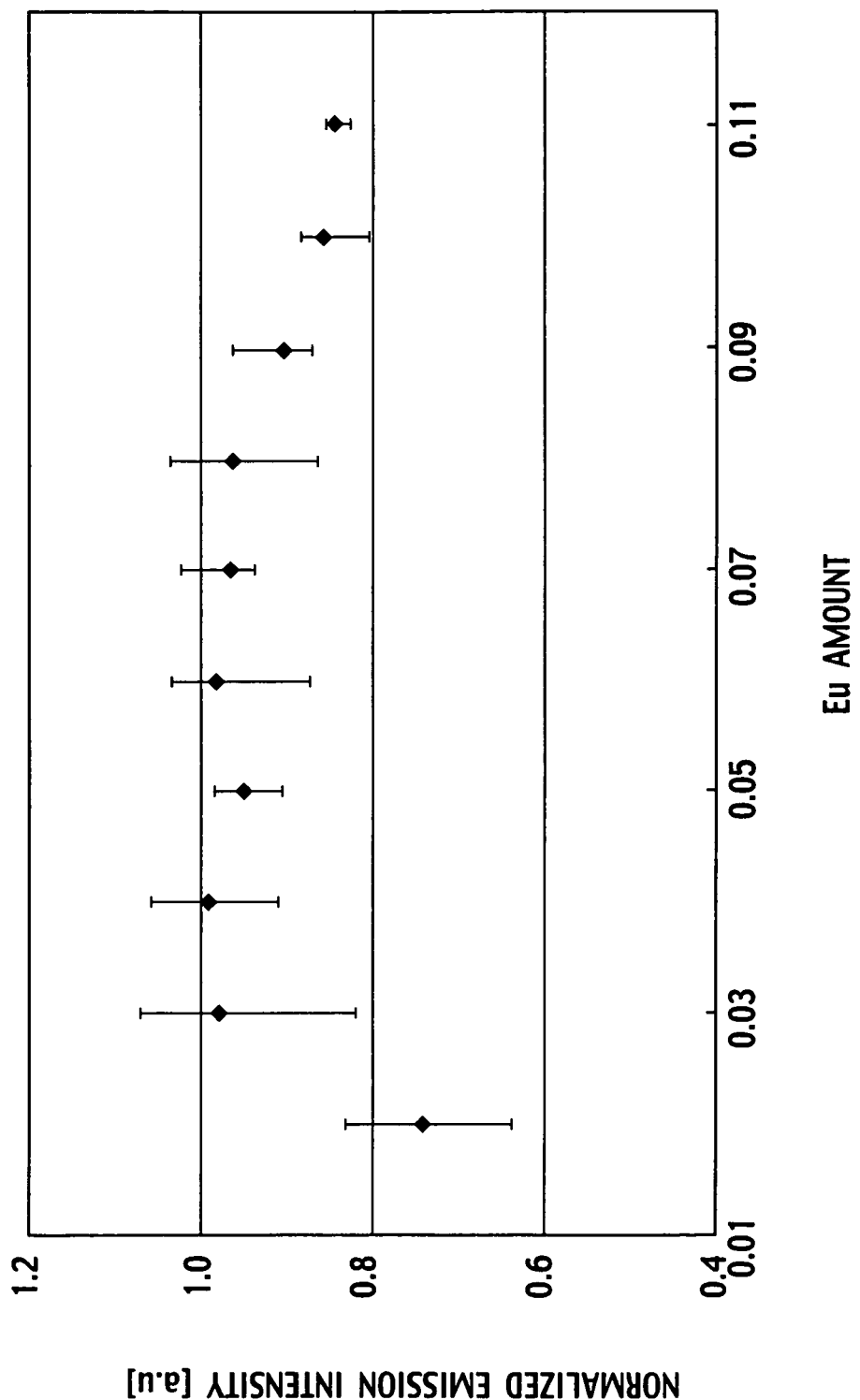
FIG. 9 illustrates a dependence of emission intensity in a peak emission wavelength of a phosphor on an EU concentration.

FIG. 8 summarizes the measurement results. FIG. 9 is a graph obtained by plotting the measured values listed in FIG. 8. In the graph, the vertical axis represents normalized peak intensity (emission intensity) and the horizontal axis represents an amount of Eu. Also, in FIG. 9, there are plotted an average value, a minimum value, and a maximum value. Such a variation in emission intensity is thought to be caused from deterioration in a surface portion of the powder phosphor, which happens in the crushing process that is not sufficiently stable.

From FIG. 9, it has been found that the α-SiAlON phosphor concerned is an excellent phosphor that exhibits a high emission intensity in a wide composition range investigated ($0.02 < q < 0.11$). Specifically, the α-SiAlON is found to have a high efficiency and improved emission intensity when a value of q is in the range of $0.02 < q < 0.09$. More specifically, the phosphor is found to have more excellent properties when a value of q is in a composition range of $0.03 \leq q \leq 0.08$. By the way, the emission intensity tends to be slightly reduced because an amount of Eu ions is low in a range of $q \leq 0.02$ and concentration quenching takes place in a range of $q \leq 0.09$.

Figure 10:
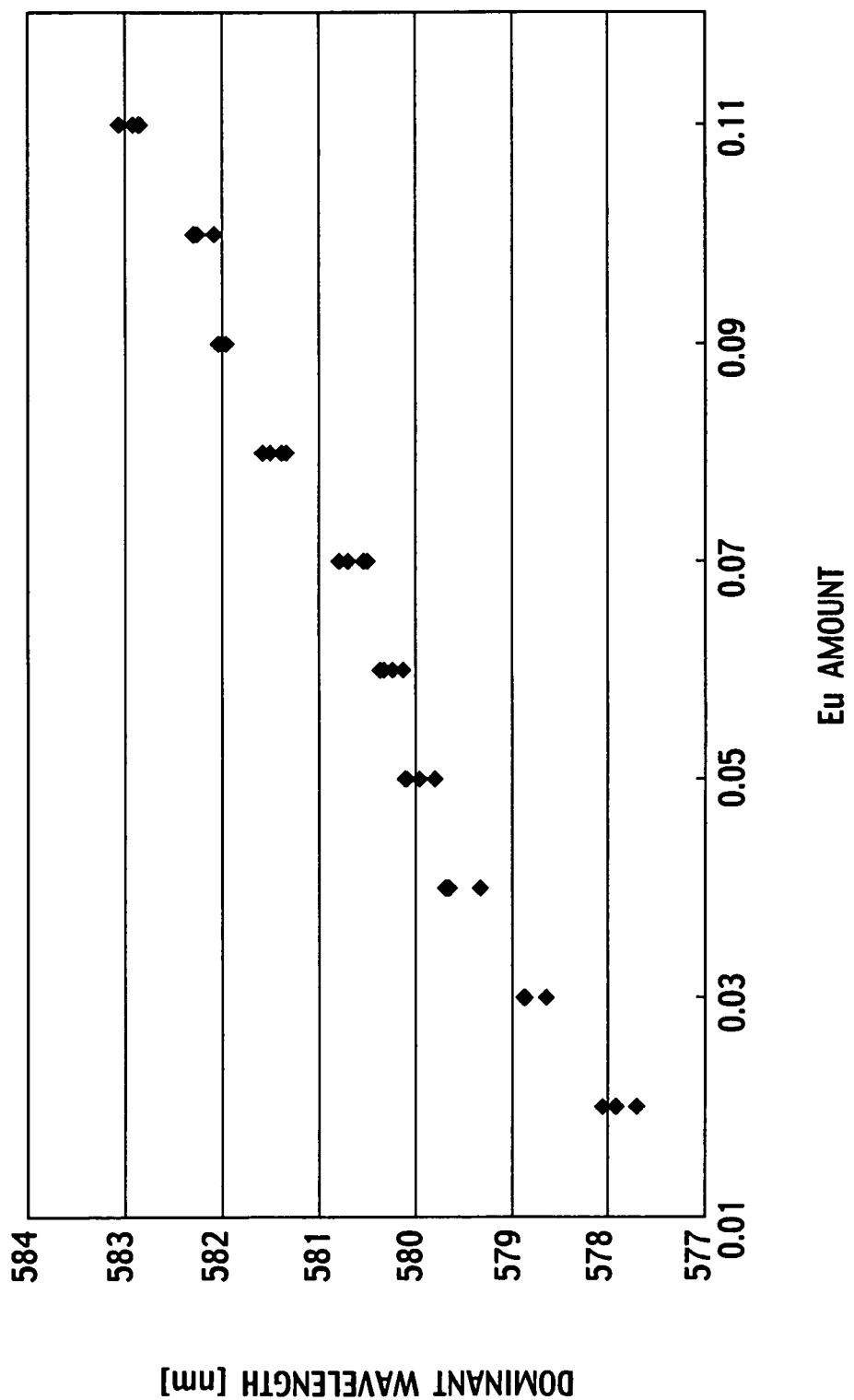
FIG. 10 illustrates a dependence of the dominant fluorescent wavelength of the phosphor on an EU concentration.

By the way, when determining which composition in the above range is most suitable, chromaticity has to be a criterion because there is no large difference in emission intensity. FIG. 10 illustrates a dependence of the dominant wavelength on an Eu amount derived from the results listed in FIG. 8. As illustrated in FIG. 10, when a value of q representing an Eu amount is in a range of from 0.02 to 0.11, the dominant wavelength changes substantially linearly in a range of from 578 nm to 583 nm. Therefore, it is found that the dominant wavelength can be precisely controlled by adjusting the composition of the α-SiAlON phosphor.

Figure 11:
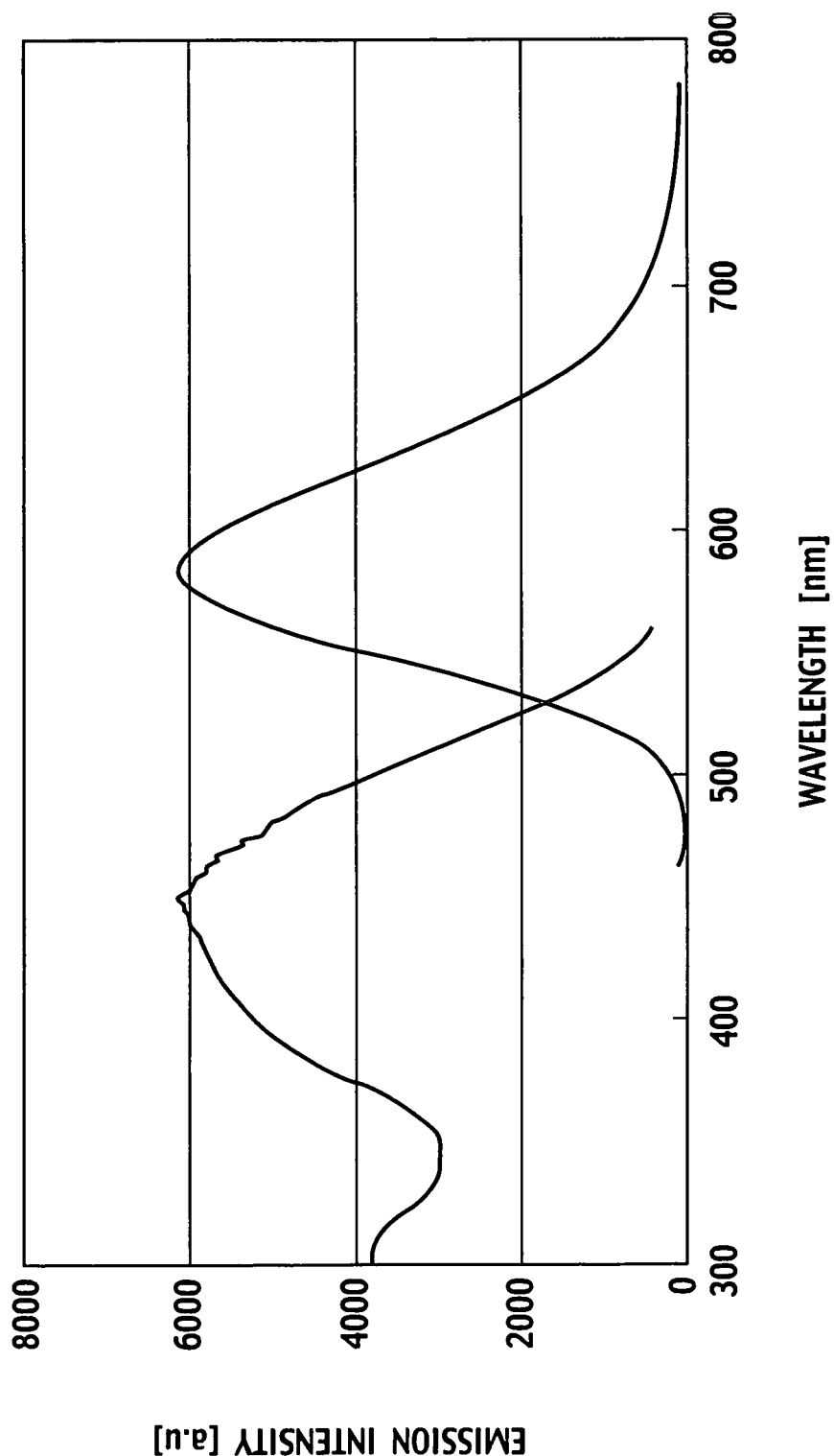
FIG. 11 illustrates excitation and emission spectra of the sample F4.

FIG. 11 illustrates excitation and emission spectra of the sample F4, the spectra being measured by the fluorescence spectrophotometer. When measuring the excitation spectrum, an emission monitoring wavelength was 585 nm, and when measuring the emission spectrum, an excitation wavelength was 450 nm.

FIG. 8 apparently shows the fact that chromaticity of the α-SiAlON phosphor can be precisely controlled by its composition. Based upon the fact, a composition range will be described in detail that enables the α-SiAlON phosphor to be suitable for a white light emitting diode lamp that emits incandescent lamp color light having a low color temperature.

Figure 12:
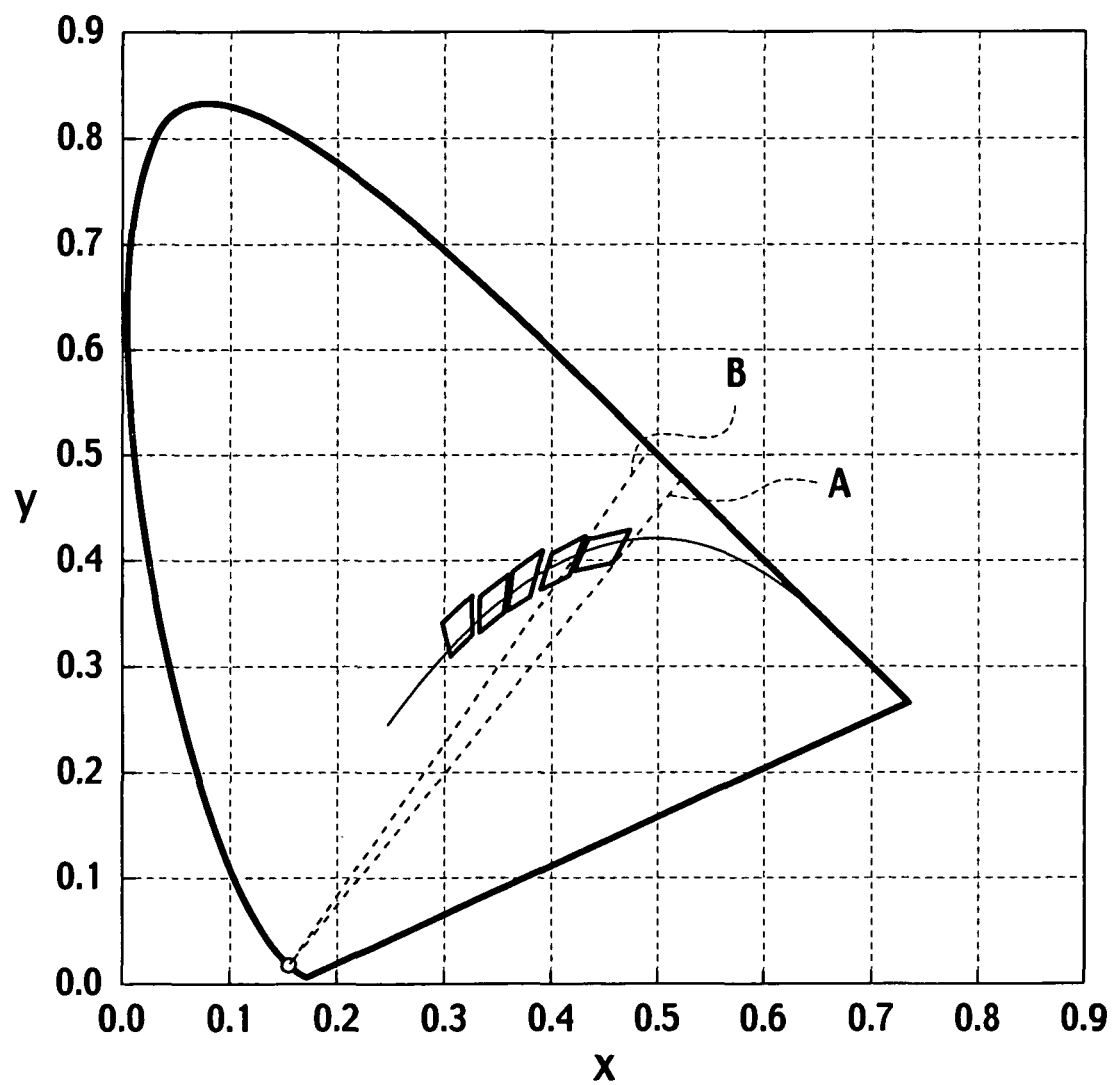
FIG. 12 illustrates chromaticity based on the CIE1931 XYZ color specification, the blackbody radiation locus, chromaticity ranges each corresponding to the daylight color, the daylight-white color, the cool-white color, the warm-white color, and the incandescent lamp color specified in JIS Z 9112, and plotted chromaticity coordinates of the light emitted from a blue light emitting diode chip having an emission wavelength of 450 nm.

FIG. 12 illustrates the blackbody radiation locus and a spectrum locus on the CIE1931 XYZ color specification diagram.

Each of five rectangles drawn on the blackbody radiation locus indicates a chromaticity defined in Japanese Industrial Standard (JIS) Z 9112-1990 "Classification of fluorescent lamps by chromaticity and color rendering property". Specifically, each indicates the daylight color, the daylight-white color, the cool-white color, the warm-white color, and the incandescent lamp color.

The open circle in the left below corner of the CIE1931 XYZ color specification diagram in FIG. 12 indicates chromaticity coordinates corresponding to the color of the light having a wavelength of 450 nm, which is emitted from a blue light emitting diode chip. The present invention places a focus on the incandescent lamp color which is defined by a quadrangle formed with the four points (x, y) of (0.4775, 0.4283), (0.4594, 0.3971), (0.4348, 0.4185), and (0.4214, 0.3887).

A first straight line A, which is one of the two dotted lines, is a straight line that passes through the chromaticity coordinates of the light having a wavelength of 450 nm emitted from the blue light emitting diode and the point of (0.4594, 0.3971) which is one of the corners of the quadrangle defining the incandescent lamp color area.

A second straight line B, which is the other dotted line, is a straight line that passes through the chromaticity coordinates of the light having a wavelength of 450 nm emitted from the blue light emitting diode and the point of (0.4348, 0.4185) which is another one of the corners.

It is generally considered that chromaticity coordinates of the light emitted from a white color light emitting diode lamp composed of a blue light emitting diode chip and a yellow phosphor which is a complementary color of blue coincide with a chromaticity point on a straight line that passes through chromaticity coordinates corresponding to blue and yellow. The point can be controlled by concentration of the phosphor dispersed in the resin or an applied amount of the phosphor-dispersed resin.

Since a white light emitting diode lamp fabricated by combining a blue light emitting diode chip having an emission wavelength of 450 nm and a phosphor having chromaticity in an area between the first straight line A and the second straight line B can have chromaticity in a sector area defined by the first straight line A, the second straight line B, and the spectrum locus in FIG. 12, a white light emitting diode lamp having its chromaticity coordinates in the incandescent lamp color area can be realized by appropriately controlling the phosphor concentration in the resin or the resin amount.

Figure 13:
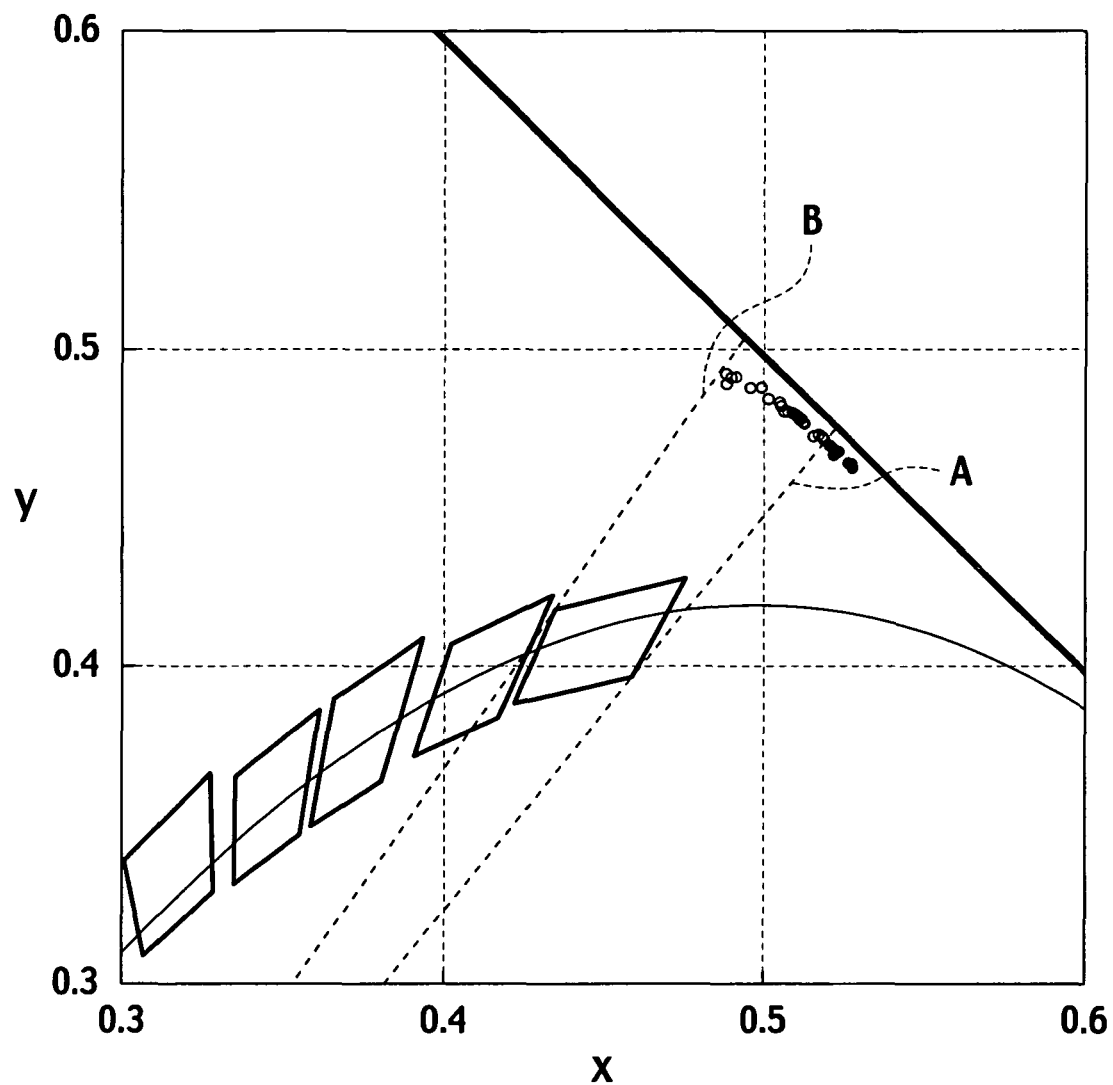
FIG. 13 is an enlargement of a part of FIG. 12.

FIG. 13 is an enlargement of FIG. 12 in which chromaticity points of each phosphor are plotted.

Open circles between the first straight line A and the second straight line B represent chromaticity coordinates of a phosphor having a value of q representing an EU amount in a range of $0.02 \leq q \leq 0.08$.

On the other hand, as for phosphors that have an EU amount of $0.09 \leq q \leq 0.11$, chromaticity coordinates represented by closed circles fall out of the range defined by the first straight line A and the second straight line B. When a white light emitting diode lamp is fabricated by using such phosphors and the blue light emitting diode chip having an emission wavelength of 450 nm, its chromaticity coordinates stay out of the incandescent lamp color area. As described above, since emission intensity decreases when a value of q is 0.02 and the value has to be $0.03 \leq q \leq 0.08$ from the viewpoint of emission intensity, the value of $0.03 \leq q \leq 0.08$ is preferable in terms of high emission intensity and appropriate chromaticity.

Figure 16:
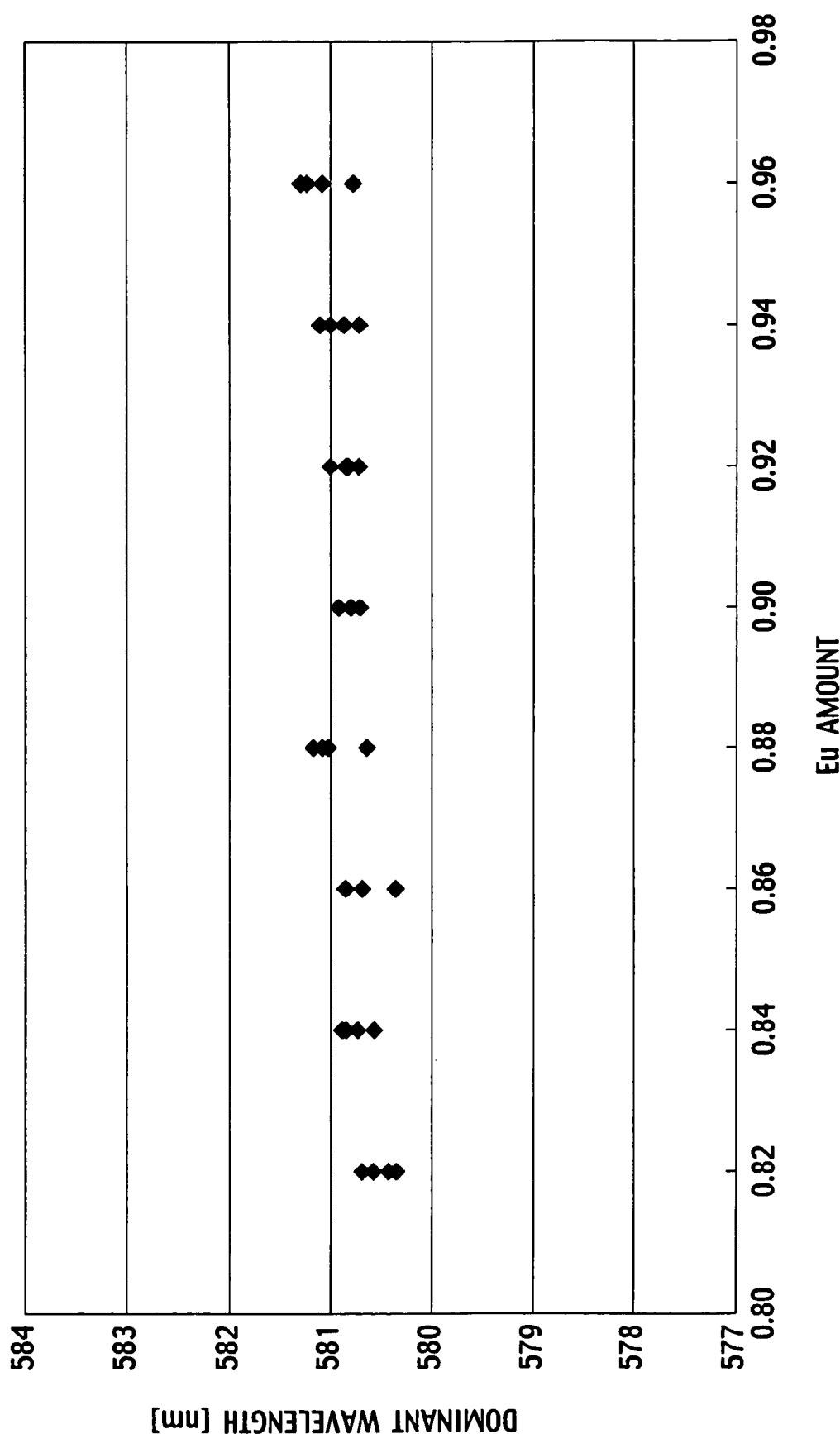
FIG. 16 illustrates a dependence of the dominant fluorescent wavelength of the sample listed in FIG. 14.
Figure 17:
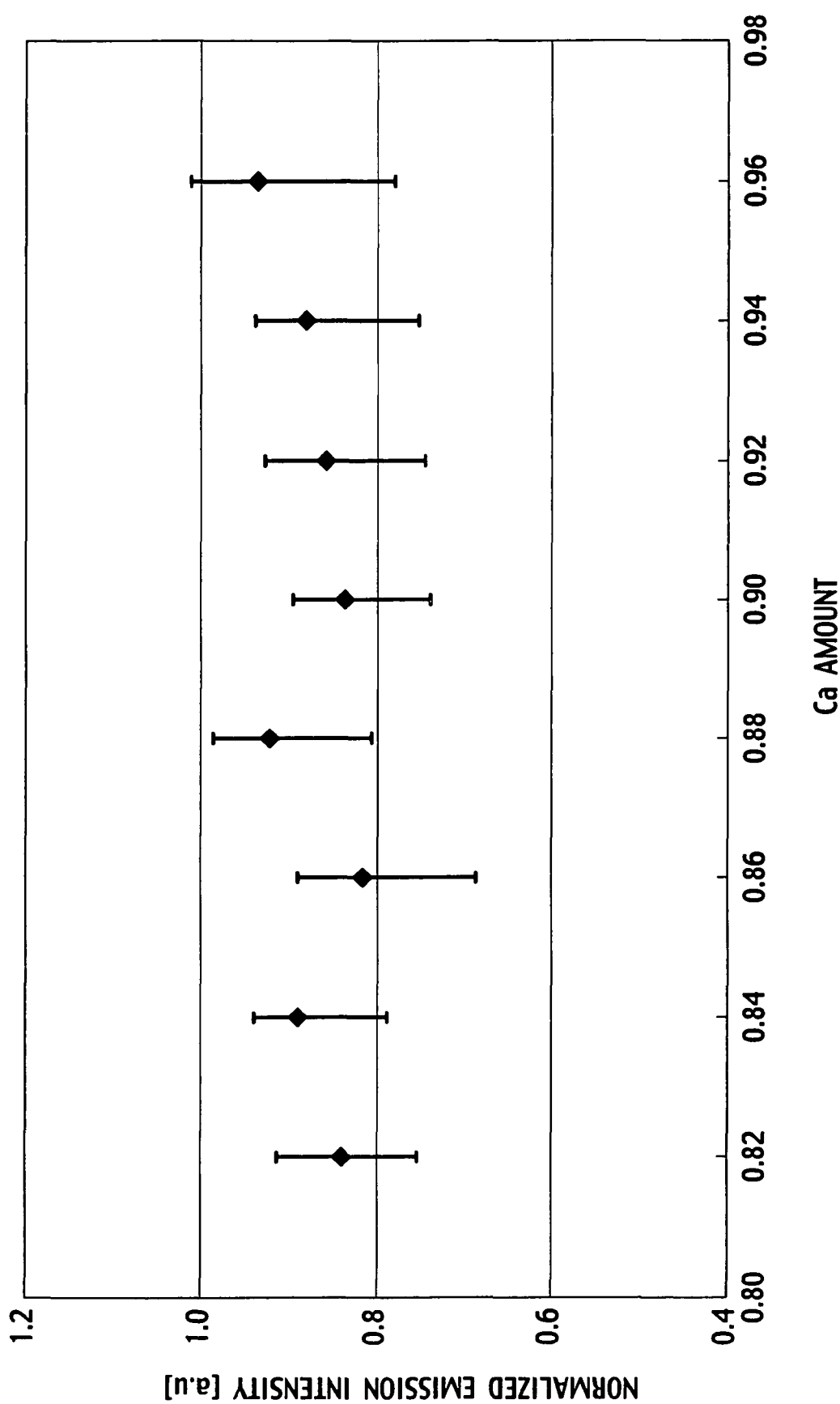
FIG. 17 illustrates a dependence of emission intensity at a peak emission wavelength of the sample listed in FIG. 14 on a Ca concentration.

As a third experiment, a dependence of optical properties of an α-SiAlON phosphor on a Ca concentration was investigated. Composition design and a mass ratio in accordance with the design are summarized in FIG. 14. Synthesis and measurement are substantially the same as in the second experiment. Measurement results are illustrated in FIGS. 15, 16, and 17.

From the experiment results in the third experiment, it has been found that a dominant wavelength and an emission intensity are not so sensitive to a change in Ca concentration. Therefore, it should be concluded that the Ca concentration may only be in the range determined in the first experiment and that it is important to precisely control the Eu concentration.

By the way, when using at least one kind of elements among Y, Mg, Li, Sc, Pr, Nd, Pm, Sm, Gd, Tb, Dy, Ho, Er, Tm, Yb, Lu, and Sr, instead of Ca, the same effect are demonstrated. It is most important to appropriately control the Eu concentration as an activator in determining optical properties. In addition, it is important to appropriately set a doping amount of co-dopants for enabling the Eu to be contained in the main phase.

<2. Center Emission Wavelength>

The center emission wavelength of a blue light emitting diode chip for use in a white light emitting device according to the present invention coincides with the peak wavelength of 450 nm in excitation spectra as apparent from FIG. 11 and FIG. 18 (described in detail hereinafter). More specifically, in the excitation spectrum of the sample Y6 illustrated in FIG. 18, the peak excitation wavelength is 449.0 nm. An emission wavelength range in which an intensity of 95% of the peak intensity is obtained is from 433.6 to 461.8 nm. An emission wavelength range that gives 90% of the peak emission intensity is 415.6 nm to 469.2 nm.

By the way, when the excitation range of from 400 nm to 480 nm as described above is applied to the sample Y6, a high emission intensity of 83% of the peak intensity can be obtained by excitation at 400 nm or 480 nm.

<3. A Composition of a Phosphor-2->

Figure 19:
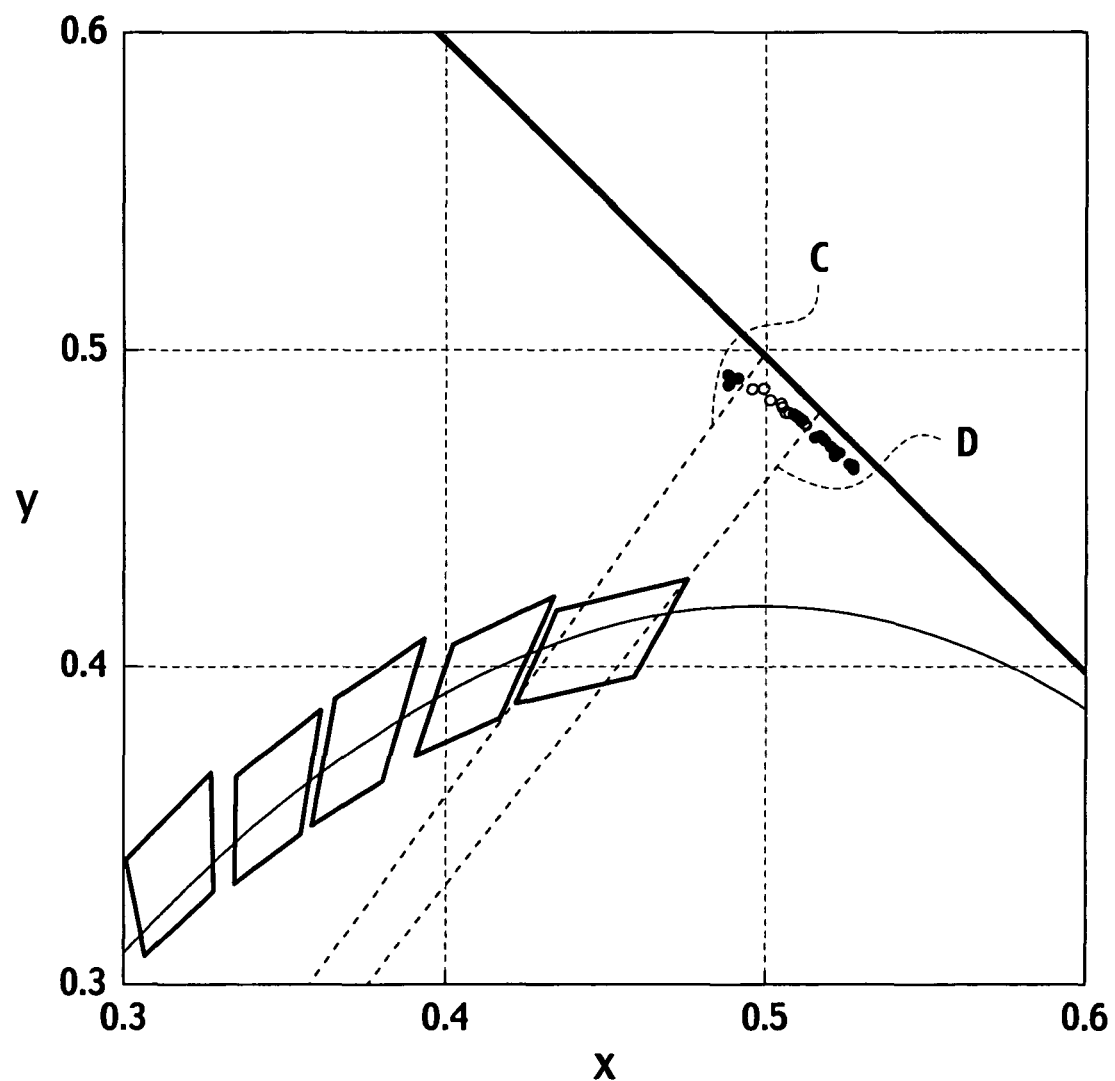
FIG. 19 is another enlargement of a part of FIG. 12.

Following the above explanation, a suitable composition of α-SiAlON phosphor for realizing an incandescent lamp color area will be described. FIG. 19 illustrates an enlargement of FIG. 12 in about the same manner as FIG. 13. However, FIG. 19 is different from FIG. 13 in that it is a third straight line C and a fourth line D that define a chromaticity range, instead of the first and the second straight lines A, B.

The third straight line C is a straight line that passes through the chromaticity coordinates of the light having a wavelength of 450 nm emitted from the blue light emitting diode and the point of (0.4214, 0.3887) which is one of the corners of the quadrangle defining the incandescent lamp color area.

The fourth straight line D is a straight line that passes through the chromaticity coordinates of the light having a wavelength of 450 nm emitted from the blue light emitting diode and the point of (0.4775, 0.4283) which is another one of the corners of the quadrangle defining the incandescent lamp color area.

In case of the area shown in FIG. 13, the chromaticity of some of the white light emitting diode lamps may fall out of the range of the incandescent lamp color area when the phosphor concentration or an amount of resin in which the phosphor is dispersed are controlled so that the chromaticity lies on the blackbody locus. However, in case of the rather narrow area shown in FIG. 19, the chromaticity falls surely within the area of incandescent lamp color when the chromaticity lies on the blackbody locus.

As for the phosphors of which chromaticities are represented by open circles, their composition is in a range of from 0.03 to 0.07 ($0.03 \leq q \leq 0.07$) when represented by a value of q representing an EU amount.

On the other hand, the phosphors having a value of $q \leq 0.02$ or $q \leq 0.08$ are out of the area between the third straight ling C and the fourth straight line D, as represented by closed circles.

When considering a production tolerance in a packaging process, the phosphors represented by the open circles are best suitable, but those by the closed circles are not.

Figure 20:
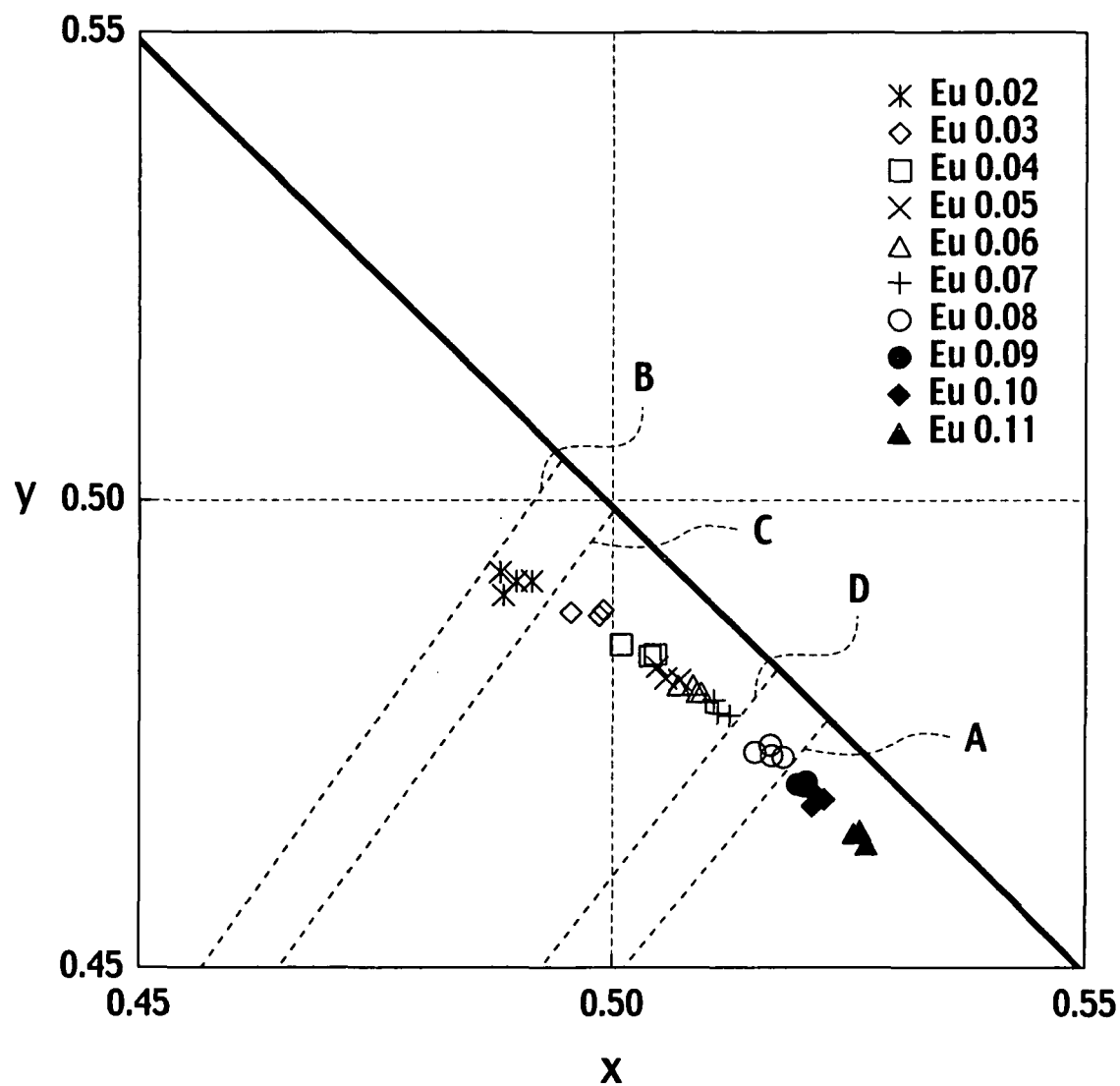
FIG. 20 is an enlargement of FIGS. 13 and 19, wherein chromaticity coordinates for each phosphor are plotted.

FIG. 20 is a further enlargement of FIGS. 13 and 19, in which chromaticity coordinates for each composition of the phosphor are illustrated in detail.

<4. A Composition of a Phosphor-3->

The $Eu^{2+}$-activated α-SiAlON phosphor preferably has Ca or Y as a main solid solution metal element.

As known so far, an $Eu^{2+}$ has such a large ionic radius that it does not easily dissolve interstitially and therefore a single phase α-SiAlON is not obtained when only the $Eu^{2+}$ is attempted to be dissolved.

In order to obtain high-purity α-SiAlON crystal by doping $Eu^{2+}$ ions, it is preferable to synthesize α-SiAlON phosphor having Ca and/or Y, both of which serve to stabilize an α-SiAlON structure, and to dope a slight amount of $Eu^{2+}$ thereto.

<5. A Composition of a Phosphor-4->

When oxides such as $CaCO_3$ and $Eu_2O_3$ are used as a starting material of a solid solution metal, $(2 \times j + 3 \times k)$ and $(2 \times j + 3 \times k)/2$ are defined as m and n, respectively, when designing a composition to realize a composition range that enables α-SiAlON crystal, assuming that M2 is a divalent cation and M3 is a trivalent cation in a general formula of $M2_j M3_k Si_{12-(m+n)} Al_{(m+n)} O_n N_{16-n}$.

When m and n that are different from those in the above expression are used in order to obtain a different composition, Ca-nitrides and Eu-nitrides or the like have to be used as a starting material.

Even when the aforementioned nitrides are used as a starting material to synthesize an α-SiAlON phosphor, the α-SiAlON having excellent properties is obtained. However, since less expensive oxides in powder form can be easily obtained, oxides as a starting material are preferable in terms of reduction in production costs.

<6. A Production Method of a Phosphor-1->

When implementing an α-SiAlON phosphor to a white light emitting diode lamp, the phosphor is dispersed to a transparent resin and an appropriate amount of the resin is applied and then cured. In this case, when a particle size of the phosphor powder is large, the powder is deposited before the resin is hardened and thus uniform dispersion of the phosphor is not realized.

In the present invention, the powders which have been obtained by crushing a mass formed after sintering were classified using a stainless steel test sieve having an aperture size of 45 micrometers to use only powders having a particle diameter of 45 micrometers or smaller.

As a result, well-uniformed dispersion of the phosphor powders is realized, thereby providing a white light emitting diode lamp having an excellent properties.

By the way, when using the powders obtained by classifying using the sieve having an aperture size of 45 micrometers, the median particle size is about 20 to 25 micrometers. A laser scattering particle size analyzer was used for measuring the particle size.

<7. A Production Method of a Phosphor-2->

In addition, when phosphors obtained by using a stainless steel test sieve having an aperture size of 20 micrometers and ethanol solution were wet-classified and dried to use for a white light emitting diode lamp, powder deposition is more difficult to take place, thereby allowing the phosphor powders to be dispersed more uniformly. As a result, chromaticity distribution of a white light emitting diode lamp was further improved.

By the way, when using the powders obtained by classifying using the sieve having an aperture size of 20 micrometers, the median particle size is about 10 micrometers. When measuring the particle size, a laser scattering particle size analyzer was used.

<8. A Particle Size of a Phosphor>

Generally, the larger the particle size is, the higher the emission intensity of a powdered phosphor becomes. On the other hand, the smaller the particle size is, the more easily the phosphor is applied.

There is a layer of the surface of the phosphor particle. Emission efficiency is lower in the layer than in the inner portion thereof. When the particle is small, the emission intensity is thought to become lower since excitation light passes through the low efficiency layer an increased number of times.

Regarding a particle size of the phosphor for use in a white light emitting diode, the following studies have been carried out so far.

First of all, Japanese Patent Publication No. 3364229 discloses that a light emitting pigment has a particle size of 20 micrometers or smaller and a $d_{50}$ value of 5 micrometers or smaller and that the $d_{50}$ value is preferably from 1 to 2 micrometers.

Secondly, Japanese Patent Application Laid-open Publication No. 2003-124527 discloses that an average particle size has to be from 0.5 to 5 micrometers.

Thirdly, Japanese Patent Application Laid-open Publication No. 2004-067837 discloses that a weight average particle size of the phosphor powder is preferably from 0.5 micrometers to 50 micrometers in order to make it easy to apply and it is more preferable when the particle size is from 2 micrometers to 10 micrometers.

Regarding a phosphor having a smaller particle size, Japanese Patent Publication No. 3364229 describes a disadvantage by reciting that "specifically, a light emitting pigment powder having a $d_{50}$ value of 5 micrometers or smaller tends to have an agglomeration effect", and disadvantages other than the agglomeration effect are not mentioned in the publication.

However, the inventors of the present invention have come to have knowledge that when the particle size of the phosphor powder becomes as small as sub-micrometers to about one micrometers the white light emitting diode using the phosphor has a remarkably low emission intensity after their experiment in which the phosphor powder was further crushed to obtain the power having a further smaller particle size and the white light emitting diode was fabricated using the granulated phosphor. Specifically, after an artillery shell type white light emitting diode was fabricated using the further smaller particle size phosphor and brightness was measured by detecting the light emitted frontward from the diode, the brightness was reduced down to one-fifths.

As one of causes that reduce the emission intensity when the particle size of the phosphor becomes sub-micrometer, it is thought that the surface of the phosphor powder was deteriorated by a ball milling, thereby leading to a reduction in emission efficiency. In addition, Mie scattering can be another cause since the particle size of the phosphor coincides substantially with a wavelength of visible light.

A parameter χ indicating a particle scattering characteristic of light is represented by an equation of $\chi = \pi D/\lambda$ (D: particle size, λ: a wavelength of light). When χ is a single digit number, it indicates a scattering characteristic based on Mie scattering. When a wavelength of from 400 nm to 700 nm is considered as a spectral range of visible light, a range of the particle size of from 0.13 micrometers to 2.0 micrometers results in the particle scattering parameter χ of 1 to 9.

An equation describing Mie scattering is obtained by solving an interaction between light as electromagnetic wave and a particle on a basis of the electromagnetic theory and is applicable to a general powder dispersion system. When Mie scattering takes place, excitation light cannot enter the inside of the phosphor particle but is reflected by its surface. In this case, the phosphor cannot serve as a wavelength conversion material. As a result, the excitation light cannot pass through the phosphor but is scattered to every direction, without being wavelength-converted.

Regarding light scattering by phosphor powders, Japanese Patent Publication No. 3364229 describes that scattering effect is only advantageous, citing "an inorganic light emitting material YAG:Ce has a particular advantage as an insoluble pigment having a refractive index of about 1.84. Therefore, the material brings about dispersing and scattering effects, in addition to wavelength conversion, thereby improving a mixture of blue light beam from a diode and yellow light resulted from the wavelength conversion", and no disadvantage is described.

However, when a complicated scattering takes place, both the blue light that is emitted from a blue light emitting diode chip and is to enter the resin dispersed with the phosphor and the yellow light emitted from the phosphor have to pass through extremely complicated paths to exit out from the light emitting diode. Therefore, since the light can be absorbed by various members that constitutes the diode lamp when traveling along such complicated paths, the emission intensity is thought to be reduced, thereby deteriorating external emission efficiency of light in the end. In this case, nonradiative absorption by the phosphor per se can take place.

The inventors of the present invention further classified the α-SiAlON phosphor that had been classified to 45 micrometers or smaller into the phosphor having a relatively smaller particle size and the phosphor having a rather larger particle size by making use of a difference in falling velocity when the phosphor is dispersed into analytical reagent grade ethanol. After the sedimentation method classification, the phosphor that was only classified to 45 micrometers or smaller is designated to a "middle" sample, another phosphor that was found to have a larger particle size than the middle sample is designated to a "large" sample, and yet another phosphor that was found to have a smaller particle size by the sedimentation method classification is designated to a "small" sample. When the samples were measured using the fluorescence spectrophotometer, the "large" sample exhibited the highest emission intensity, the "middle" sample exhibited the next highest emission intensity, and the "small" sample exhibited the lowest emission intensity.

It should be noted here that the "large" sample was obtained by eliminating the "small" sample from the "middle" sample. In other words, the emission efficiency of the powder phosphor can be improved only by selectively eliminating the phosphor having a small particle size.

Since nothing but selectively eliminating the phosphor powder having a small particle size was carried out, each particle in the sample "large" that contributes to a high emission intensity is more or less the particles in the sample "middle". Therefore, it has been found that a presence of the phosphor powder having a small particle size reduces the emission intensity or external emission efficiency.

In addition, the inventors of the present invention fabricated an artillery shell type white light emitting diode using the samples "large", "middle", and "small" and carried out brightness measurements by detecting light emitted frontward therefrom for comparison purposes.

In the white light emitting diode using the "large" sample, the emission intensity of not only yellow light emitted from the phosphor but also the blue light that transmitted therethrough were improved compared with the white light emitting diode using the "middle" sample.

This means that the external light emission efficiency in the white light emitting diode is significantly improved by selectively eliminating small phosphor powders having a particle size of less than 2 to 3 micrometers from the classified phosphor.

On the other hand, in the white light emitting diode using the "small" sample, the emission intensity of not only yellow light emitted from the phosphor but also the blue light that transmitted therethrough were reduced compared with the white light emitting diode using the "middle" sample.

In order to improve the emission efficiency of the white light emitting diode lamp, studies are necessary for improvement in external emission efficiency by improving a packaging designing. From the aforementioned results, it is preferable to eliminate or reduce the phosphor powders having a particle size of 2 micrometers or smaller that may cause Mie scattering so that a ratio of such phosphor powders to the whole amount becomes to 10% or less.

<9. A Production Method of a Phosphor-3->

In order to obtain high emission efficiency phosphor powders, it is important to make a mechanical crushing process unnecessary. To this end, it is preferable that starting material powders are directly loaded into a high pressure sintering furnace without palletizing. Then, the powders are sintered by gas-pressurizing, not by hot pressing. In other words, the powders are preferably sintered while they remain in powder form.

This is possible by wet-mixing the starting materials, drying, granulating and classifying by a use of a test sieve to obtain aggregates having a particle size of certain dimension or smaller, charging the powders into a container while they remain in powder form of a powder density of 20% or less, without pressure forming, loading the container into a sintering furnace, and gas-pressurizing under a nitrogen atmosphere.

Although the powdery sintered-body removed from the sintering furnace was solidified into a mass, it can be manually crushed by using a mortar.

By adopting such a method, an α-SiAlON phosphor powder can be obtained without applying a great force by a mechanical crushing means that may deteriorate the surface of the phosphor powder.

The phosphor obtained by the above method exhibits a higher emission intensity than the phosphor obtained by tentatively palletizing and mechanically crushing after sintering.

<10. A Production Method of a Phosphor-4->

The particle size of the α-SiAlON phosphor powder obtained by crushing the mass formed during sintering is substantially the same as or becomes slightly larger than that of the aggregates obtained by granulating by use of a test sieve in advance.

In order to disperse the α-SiAlON phosphor powder to resin and then to package a white light emitting diode, since the particle size is preferably 45 micrometers or smaller, or more preferably 20 micrometers or smaller, it is preferable to classify the aggregates having a particle size of 45 micrometers or smaller when granulating by use of a test sieve or the like after the starting material powders are wet-mixed and dried.

Although it is more preferable to granulate down to 20 micrometers or smaller, if possible, a test sieve having an aperture of 20 micrometers does not let the powders pass therethrough because of aggregation of the powders. This is not because of a larger primary particle size but because of moisture or static electrical charge.

<11. A Production Method of a Phosphor-5->

As for sintering, a high pressure sintering under a nitrogen atmosphere is preferable. In order to prevent oxidation or decomposition during sintering, not only a nitrogen atmosphere but also pressurization is important. By the way, regarding the pressure, it is thought to be preferable if the pressure is an atmospheric pressure or more. However, in order to conduct sintering assuredly, the pressure is more preferably two atoms or more.

<12. A Production Method of a Phosphor-6->

Sintering temperature is preferably 1700 degrees Celsius. In order to determine an appropriate sintering temperature, α-SiAlON phosphors were sintered at a temperature of about 1500, 1600, 1700, and 1800 degrees Celsius. The phosphor sintered at about 1500 degrees Celsius exhibited only a low emission intensity. In addition, a powder X-ray diffraction pattern revealed a lot of peaks originating from its starting materials, which indicates that the sintering is insufficient. On the other hand, the phosphors sintered at about 1600 degrees Celsius or higher is found to be composed of a single phase of α-SiAlON crystal from the powder X-ray diffraction measurement.

In addition, measurements of emission intensity for each sample revealed that the phosphor sintered at about 1700 degrees Celsius exhibited the highest emission intensity and the phosphor sintered at 1800 degrees Celsius exhibited a reduced emission intensity. Therefore, about 1700 degrees Celsius are most preferable as the sintering temperature.

<13. A Production Method of a Phosphor-7->

A sintering time at the sintering temperature is preferably 20 hours or longer. From a result of emission intensity measurements for phosphors sintered for 2 hours, 8 hours, 24 hours and 50 hours, respectively, the phosphor sintered for 8 hours exhibited a higher emission intensity compared with the phosphor sintered for 2 hours. In addition, the phosphor sintered for 24 hours exhibited a higher emission intensity compared with the phosphor sintered for 8 hours, while there was not a significant difference between the phosphors sintered for 24 hours and 50 hours, in terms of emission intensity. From these results, it has been found that the sintering time of 24 hours is thought to be sufficient. Moreover, further investigation revealed that the sintering time of 20 hours or longer is sufficient.

<14. A Production Method of a Phosphor-8->

As starting materials, it is preferable to use α-Silicon Nitride (α-$Si_3N_4$), Aluminum Nitride (AlN), Calcium Carbonate ($CaCO_3$), and Europium Oxide ($Eu_2O_3$).

Although it is possible to use nitride materials, powder materials of $CaCO_3$ and $Eu_2O_3$ are less expensive and can be easily obtained, thereby contributing to a reduction in production costs.

Moreover, oxide starting materials for another solid solution metal elements in addition to Ca and Eu may be easily obtained.

<15. A Production Method of a Phosphor-9->

In a process in which α-Silicon Nitride (α-$Si_3N_4$), Aluminum Nitride (AlN), Calcium Carbonate ($CaCO_3$), and Europium Oxide ($Eu_2O_3$) as starting materials are wet-mixed by a planetary ball mill, n-hexane as solvent is preferably added into a container made of Silicon Nitride along with the starting materials and balls made of Silicon Nitride.

If hydroxyl-containing solvents like ethanol are used for wet-mixing, Aluminum Nitride decomposes, which prevents α-SiAlON phosphor from assuredly being synthesized.

<16. A Production Method of a Phosphor-10->

In order to carry out a sintering process under a nitrogen atmosphere by use of a high pressure sintering apparatus, it is necessary to replace the air in the sintering furnace with nitrogen by use of a vacuum pump.

In this case, the powder to be sintered is not directly loaded in the vacuum apparatus because clogging may take place in vacuum lines when the powders are vacuumed up.

In the present invention, the starting materials in powder form are charged into a white covered-container made of Boron Nitride and thus the container is loaded into the sintering furnace, thereby preventing the clogging in the vacuum lines.

By the way, as a material for the container, various ceramics can be used in addition to Boron Nitride, as far as the material does not react with the powder materials at the sintering temperatures.

However, if the material for the container has a strong color, the chipped flakes may place an adverse effect on the phosphor properties when the container is chipped and the chipped flakes are included in the phosphor powder. Therefore, the color of the material is preferably white.

<17. An Experiment on Chromaticity Stability>

Japanese Patent Application Laid-open Publication No. 2003-124527 describes that quantum efficiency of an α-SiAlON phosphor does not decrease even when it is heated up to 80 degrees Celsius. The inventors of the present invention have examined a temperature stability of chromaticity of a light emitting diode lamp using an α-SiAlON phosphor to verify advantages of such a light emitting diode lamp over a conventional light emitting diode lamp using an oxide phosphor.

The α-SiAlON phosphor used in this experiment has the same composition as the sample 8 in FIG. 1 and has been sintered at a temperature of about 1,700 degrees Celsius in a 0.5 MPa Nitrogen atmosphere for about 24 hours.

Figure 21:
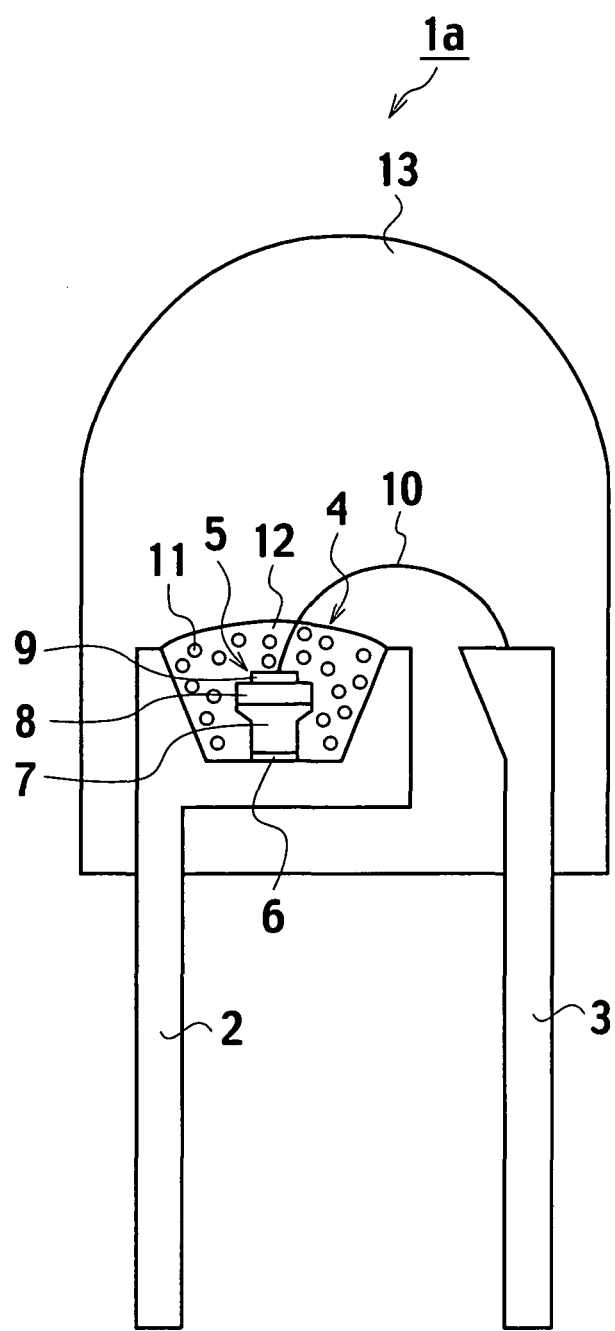
FIG. 21 is a cross-sectional view of an artillery shell type light emitting diode lamp according to a first embodiment of the present invention.
Figure 22:
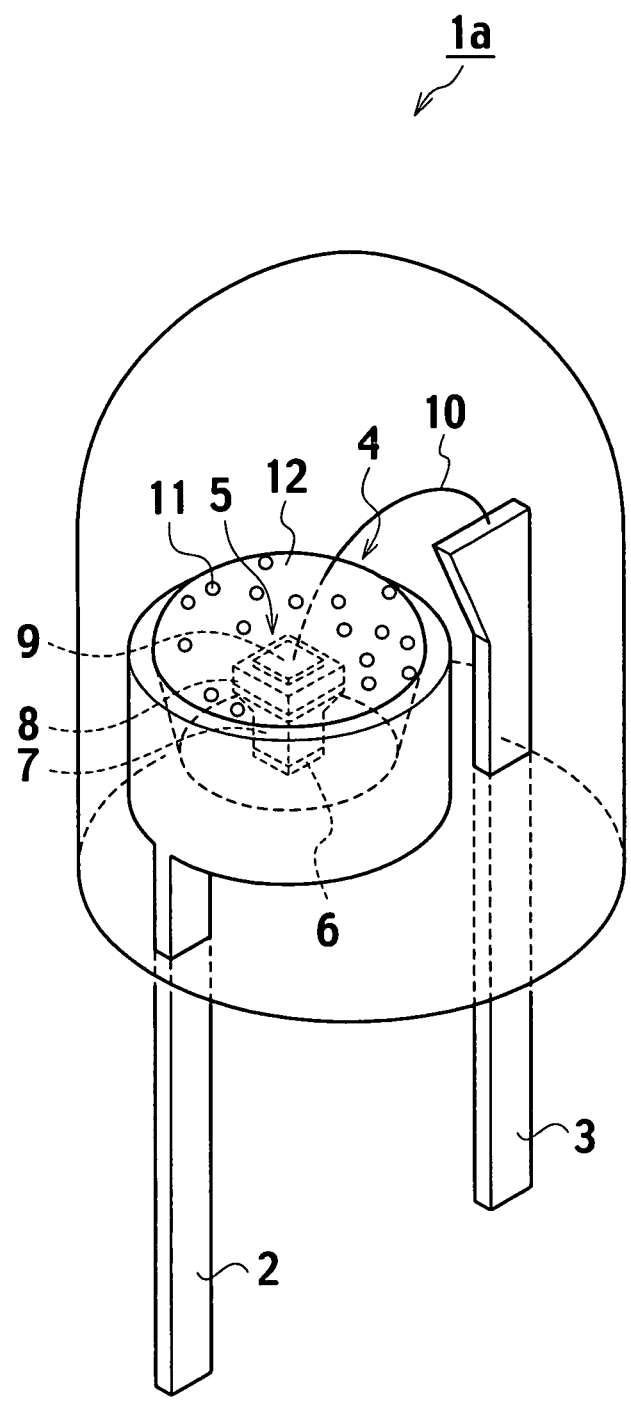
FIG. 22 is a perspective view of the artillery shell type light emitting diode in FIG. 21.

Using this phosphor, an artillery shell type light emitting diode lamp which was the same as the artillery shell type light emitting diode lamp 1*a* illustrated in FIGS. 21 and 22 was fabricated. In this case, an applied amount of resin dispersed with the phosphor was intentionally increased compared with an appropriate amount. The fabricated light emitting diode lamp has chromaticity coordinates (x, y) of (0.503, 0.463) at room temperature and (0.509, 0.464) at 200 degrees Celsius by heating with hot air. The chromaticity difference between the temperatures corresponds to a distance shift of only 0.006 on the CIE1931 chromaticity diagram.

In addition, a light emitting diode lamp using a known commercially available phosphor P46-Y3 was fabricated in the same manner for comparison. Also as for this diode lamp, an applied amount of resin dispersed with the phosphor is intentionally increased compared with an appropriate amount. The fabricated light emitting diode lamp has chromaticity coordinates (x, y) of (0.393, 0.461) at room temperature and (0.383, 0.443) at 200 degrees Celsius by heating with hot air. The chromaticity difference between the temperatures corresponds to a distance shift of as large as 0.021 on the CIE1931 chromaticity diagram.

From the above results, it has been verified that the temperature dependence of chromaticity of the light emitting diode lamp using the α-SiAlON phosphor is just one-thirds or less compared with that of the light emitting diode lamp using a conventional oxide phosphor and therefore the light emitting diode lamp using the α-SiAlON phosphor has an excellent temperature stability.

In addition, the α-SiAlON phosphor is excellent in thermal and mechanical properties and can prevent thermal quenching that causes an excitation energy loss. Therefore, in the phosphor according to the present invention, a reduction in emission intensity with an increase of temperature is decreased, thereby increasing a range of working temperatures compared with conventional phosphors.

Moreover, α-SiAlON is chemically so stable that the phosphor according to the present invention has an excellent light resistance.

As described above, the phosphor according to the present invention is suitable for use in various light emitting apparatuses and display apparatuses, and best suitable especially as a wavelength conversion material for incandescent lamp color light emitting diode lamp that emits light having a low color temperature.

Next, preferred embodiments according to the present invention will be described. The following embodiments are intended for purposes of illustration only and are not intended to limit the scope of the invention. Therefore, whereas those skilled in the art can devise various types of working examples including each and all elements, all the examples fall within the scope of the present invention.

In addition, in all the drawings used as an aid for describing the following embodiments, identical reference marks will be used to designate identical or corresponding elements, thereby eliminating unnecessary repetition of description about the identical elements.

A First Embodiment

FIG. 21 is a cross-sectional view of an artillery shell type light emitting diode lamp 1a according to a first embodiment (Embodiment 1). FIG. 22 is a perspective view of the artillery shell type light emitting diode lamp 1a.

First, a phosphor 11 in those figures will be described.

A composition of the phosphor 11 is designed as $Ca_{0.875}Si_{90.06}Al_{2.94}O_{0.98}N_{15.02}:Eu^{2+}_{0.07}$, which is the same as the sample F.

As starting materials, 65.78 wt % of $\alpha$-$Si_3N_4$, 18.71 wt % of AlN, 13.59 wt % of $CaCO_3$, and 1.91 wt % of $Eu_2O_3$ were weighed and charged into a container made of Silicon Nitride along with n-hexane as solvent and balls made of Silicon Nitride. Next, the materials were wet-mixed by a planetary ball mill for 2 hours at 150 rotations per minute (rpm).

Then, the mixed materials were dried by a rotary evaporator and then the dried materials in powder form were pounded well in a mortar. Next, the pounded materials were granulated using a stainless steel test sieve in compliance with JIS Z 8801 having an aperture size of 125 micrometers to obtain powdered materials having a corresponding particle diameter, which were then charged into the covered container made of Boron Nitride.

Next, a sintering process was carried out for the powder materials using a high pressure sintering apparatus at a temperature of 1,700 degrees Celsius in a 0.5 MPa Nitrogen atmosphere for about 50 hours.

After the sintering, since the powder materials were solidified into a mass when unloaded from the apparatus, the mass was then pounded into powders in a mortar with an application of a little force. Then, the pounded materials were classified using a stainless steel test sieve in compliance with JIS Z 8801 having an aperture size of 45 micrometers to select powdered materials having a corresponding particle diameter. The selected powder materials so obtained are referred to as a sample Y6 hereinafter.

Figure 18:
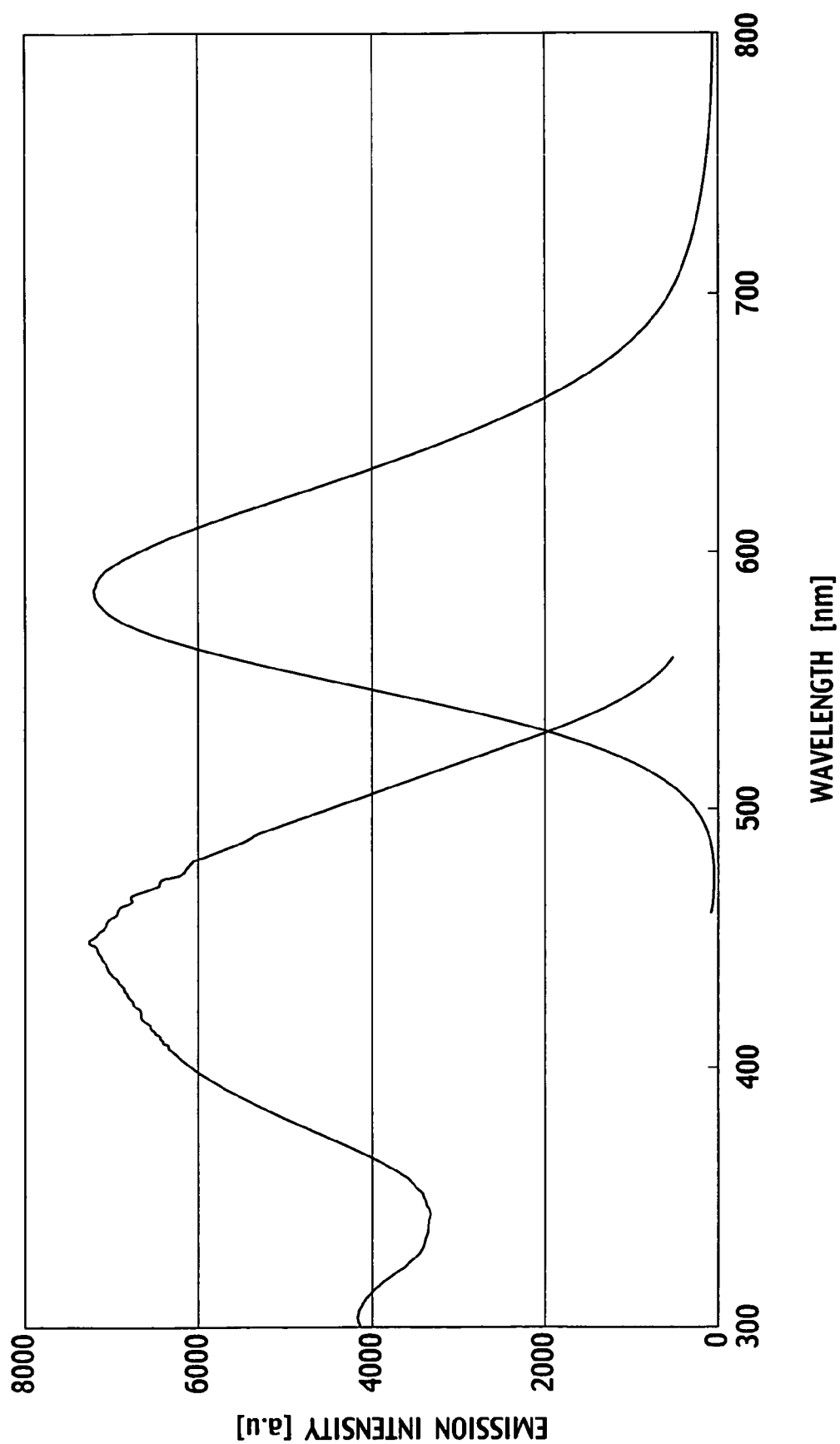
FIG. 18 illustrates excitation and emission spectra of a sample Y6.

FIG. 18 illustrates excitation and emission spectra of the sample Y6.

The emission monitoring wavelength when measuring the excitation spectrum was set at 585 nm and the excitation wavelength when measuring the emission spectrum was set at 450 nm. In addition, the peak excitation wavelength was 449.0 nm.

The peak emission wavelength is 586.0 nm; the dominant emission wavelength is 581.2 nm; and chromaticity coordinates of (x, y) are (0.517, 0.476).

These have been shifted slightly toward longer wavelengths compared with the aforementioned samples F1 to F4. This is thought to be caused by a prolonged sintering time from 8 hours to 50 hours. The Storks shift was 5210 $cm^{-1}$, which is smaller than that conventionally reported for α-SiAlON phosphors.

Figure 23:
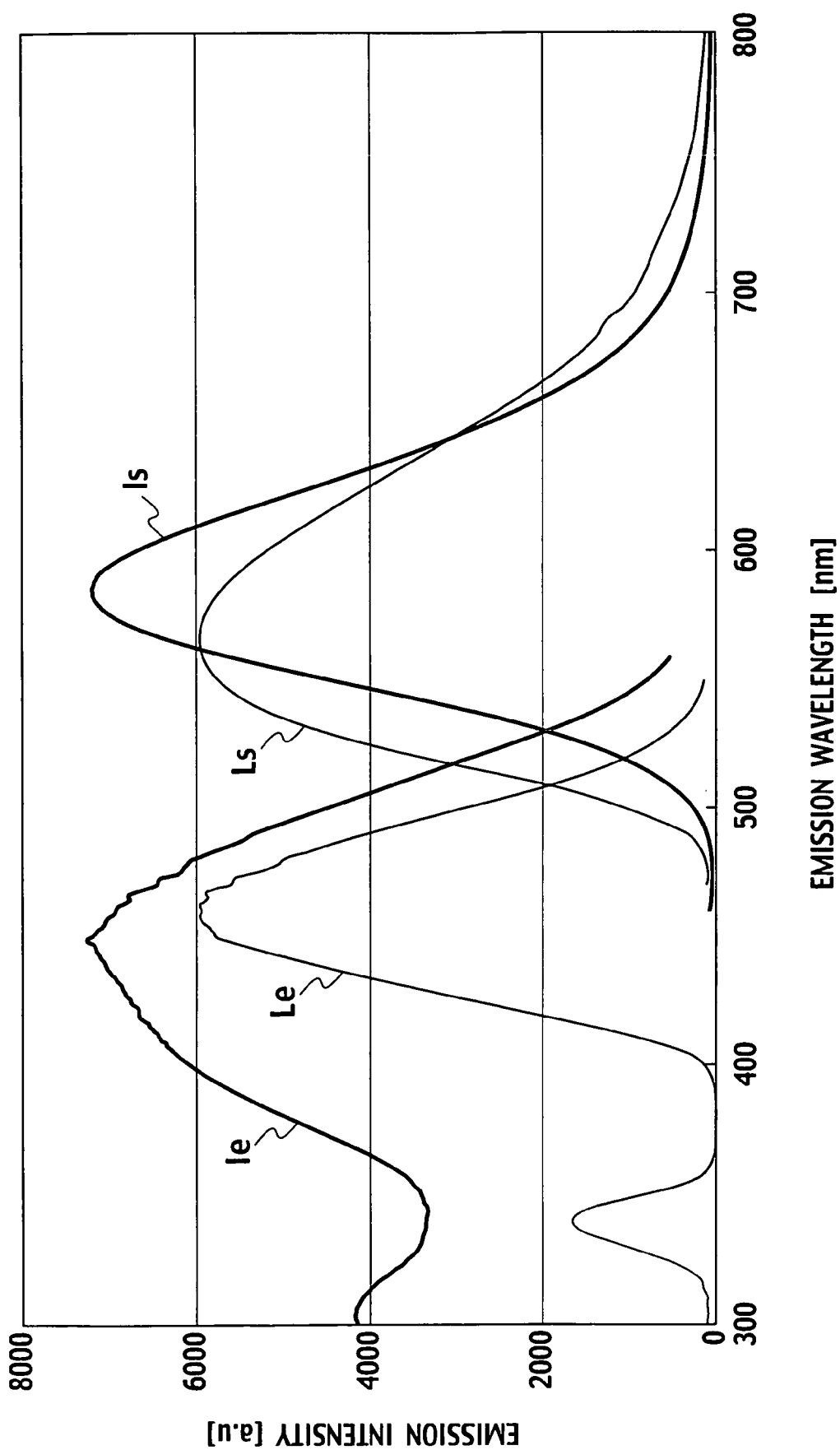
FIG. 23 illustrates excitation and emission spectra of the sample Y6 and a commercially available phosphor.

FIG. 23 illustrates a comparison between excitation and emission spectra of the sample Y6 and those of commercially available Yttrium Aluminum Garnet phosphor. The commercially available phosphor for comparison has a composition represented by a general formula of $(Y, Gd)_3Al_5O_{12}:Ce^{3+}$. In FIG. 23, lines $I_e$ and $I_s$ indicate excitation and emission spectra of Y6, respectively, which are the same as those in FIG. 18. On the other hand, lines $L_e$ and $L_s$ in FIG. 23 indicate excitation and emission spectra of the phosphor for comparison, respectively. An emission monitoring wavelength when measuring the excitation spectrum Le was 568 nm and an excitation wavelength of 460 nm was used when measuring the emission spectrum $L_s$.

As illustrated in FIG. 23, the sample Y6 has an extremely high emission intensity compared with the commercially available YAG phosphor and has a wide excitation range from ultraviolet light region to blue light region, which is indicative of an excellent phosphor.

Next, the structure of the artillery shell type light emitting diode lamp 1a will be described.

As illustrated in FIGS. 21 and 22, the artillery shell type light emitting diode lamp 1a is formed into a tubular shape with a round end at its top, in other words, a shape resembling an artillery shell. The light emitting diode lamp 1a is composed of lead wires 2, 3, a blue light emitting diode chip 5, a bonding wire 10, the aforementioned phosphor 11, a first resin 12, and a second resin 13. The lower portion of the lead wires 2, 3 is exposed out of the second resin 13.

The blue light emitting diode chip 5 is composed of a lower electrode 6, a SiC substrate 7, an InGaN light emitting layer 8, and an upper electrode 9. A center emission wavelength of the blue light emitting diode chip 5 is about 454 nm.

At the upper end of the lead wire 2, there is provided a cup 4 in which the blue light emitting diode chip 5 is placed. The lower electrode 6 and the bottom face of the cup 4 are electrically connected by electrically conductive paste and the upper electrode 9 and the lead wire 3 are electrically connected by the bonding wire 10.

In addition, the vicinities of the light emitting diode chip 5, including the recess of the cup 4, are sealed with the first resin 12 into which the phosphor 7 is dispersed at 25 wt % (weight percent).

Furthermore, the lead wires 2, 3, the blue light emitting diode chip 5, the bonding wire 10, and the first resin 12 are sealed with the second resin 13.

By the way, the resins 12, 13 are both transparent and the same epoxy resin.

Next, a manufacturing procedure will be described about the above artillery shell type light emitting diode lamp 1a.

In a first process, the blue light emitting diode chip 5 is die-bonded in the cup 4 with electrically conductive paste.

In a second process, the blue light emitting diode chip 5 is wire-bonded to the other lead wire 3 with the bonding wire 10.

In a third process, the first resin 12 dispersed with the phosphor 11 is pre-deposited onto the cup 4 so as to coat the blue light emitting diode chip 5 and then cured.

In a fourth process, an upper portion of the lead wires 2, 3, the blue light emitting diode chip 5 and the resin 12 are enfolded with the resin 13 and then the resin 13 is cured. The fourth process is ordinarily carried out by casting.

By the way, the lead wires 2, 3 can be made as an integral member in which both of the wires are connected at their ends. When using such lead wires, a fifth process has to be provided after the fourth process, wherein the connecting portion between the lead wires is removed to separate the lead wires 2, 3 into an individual member.

Figure 24:
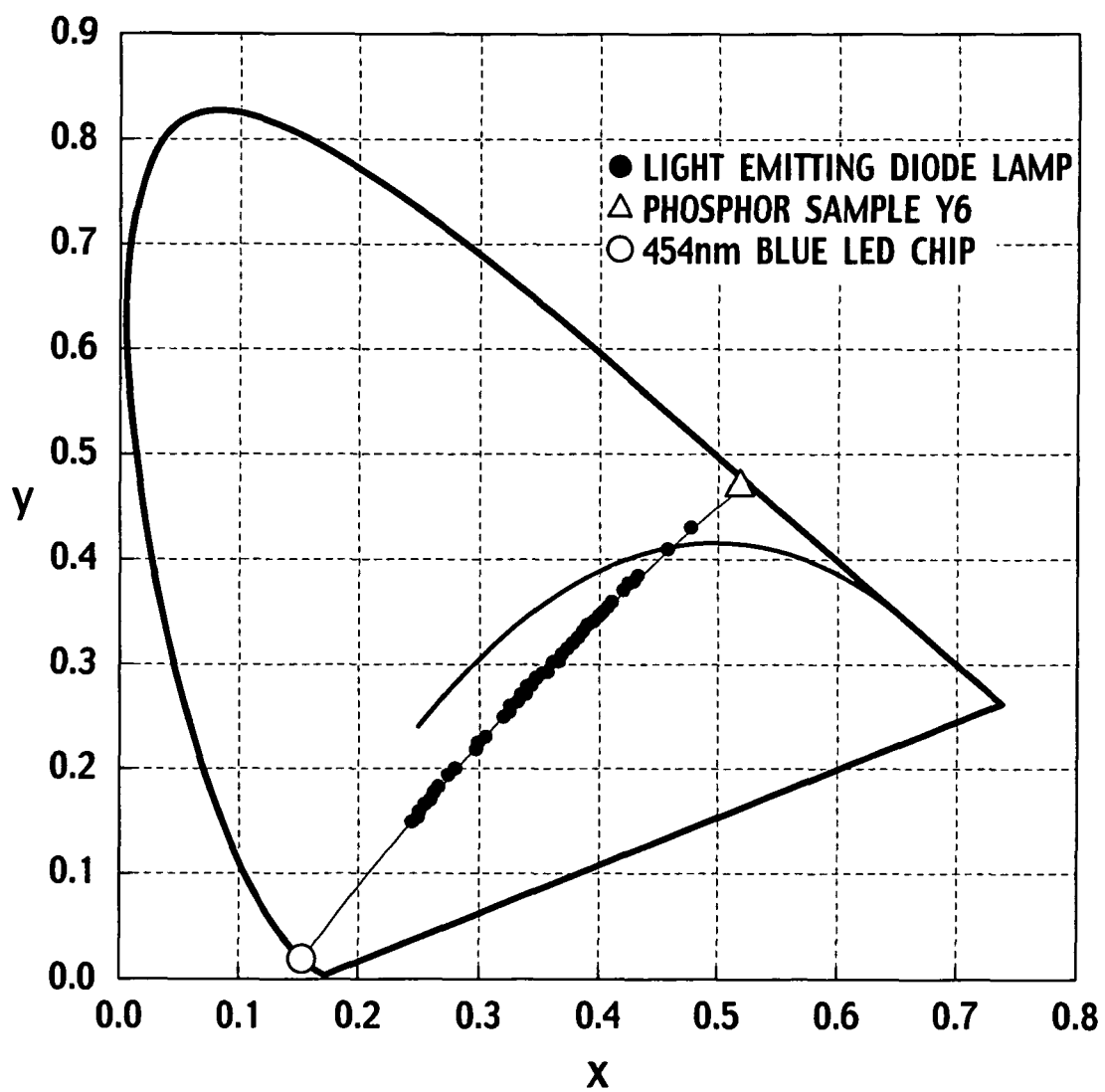
FIG. 24 illustrates a CIE1931 XYZ chromaticity diagram on which chromaticity coordinates of the light emitted from a plurality of light emitting diode lamps each having a different application amount of the resin dispersed with the phosphor are plotted.

FIG. 24 illustrates a CIE1931 XYZ color specification diagram on which chromaticities of light emitted from a plurality of artillery shell type light emitting diode lamps 1a, each of which was made by changing an application amount of the resin 12 dispersed with the phosphor 11, are plotted. Based on the experiment results, an appropriate application amount was determined.

Figure 25:
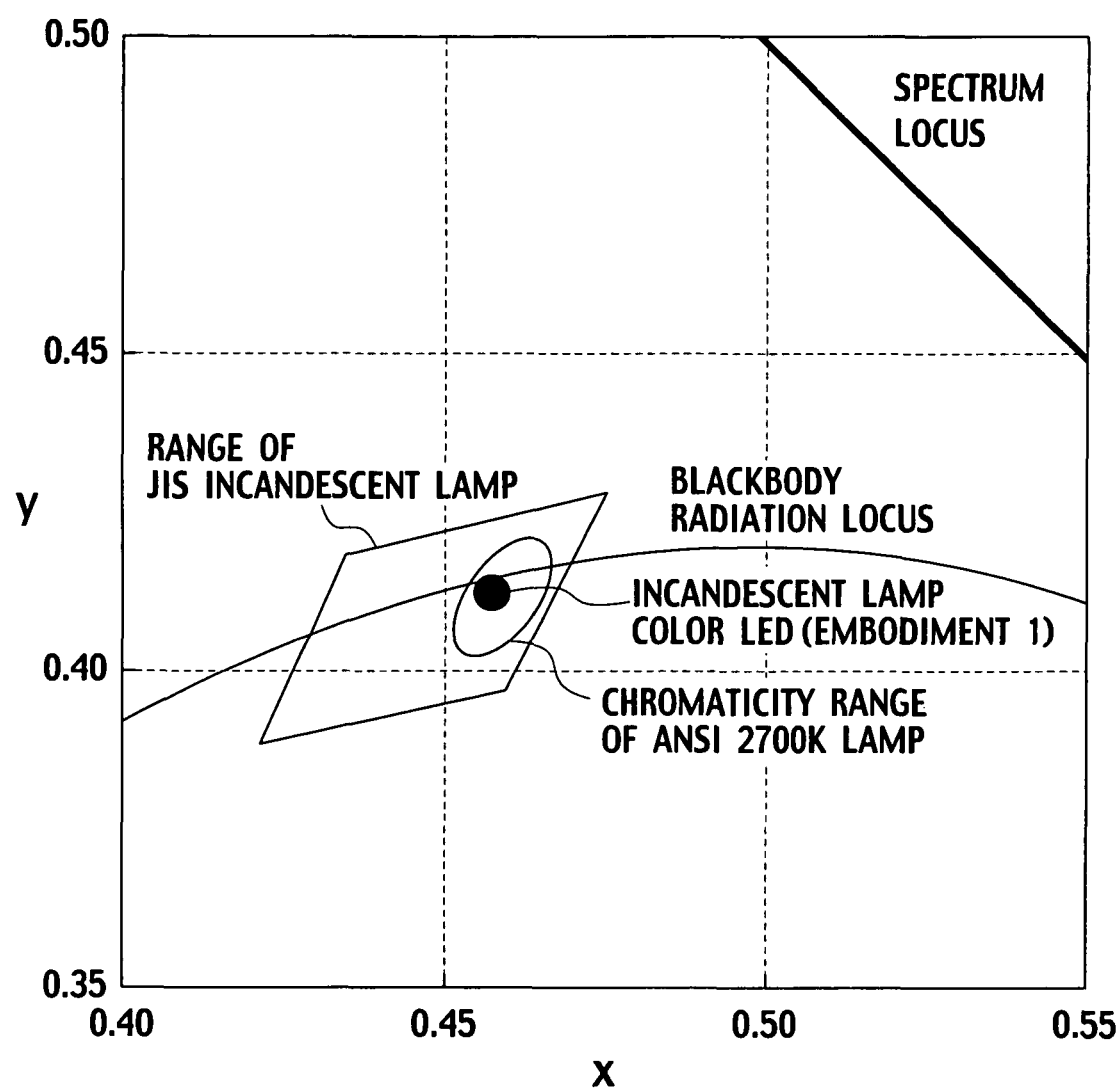
FIG. 25 illustrates that the chromaticity of the light emitted from the artillery shell type light emitting diode lamp in FIGS. 21 and 22 is within the incandescent lamp color area defined in JIS and within the 2700K-lamp color boundaries specified in ANSI C78.386.

As illustrated in FIG. 25, chromaticity coordinates of the light emitted from the artillery shell type light emitting diode lamps 1a can lie on the blackbody locus by appropriately controlling the application amount of the phosphor 11.

In addition, those chromaticity coordinates fall within the incandescent lamp color area specified in JIS Z 9112 and at the same time within the chromaticity area within the 2700K-lamp color boundaries specified in ANSI C78.386.

Figure 26:
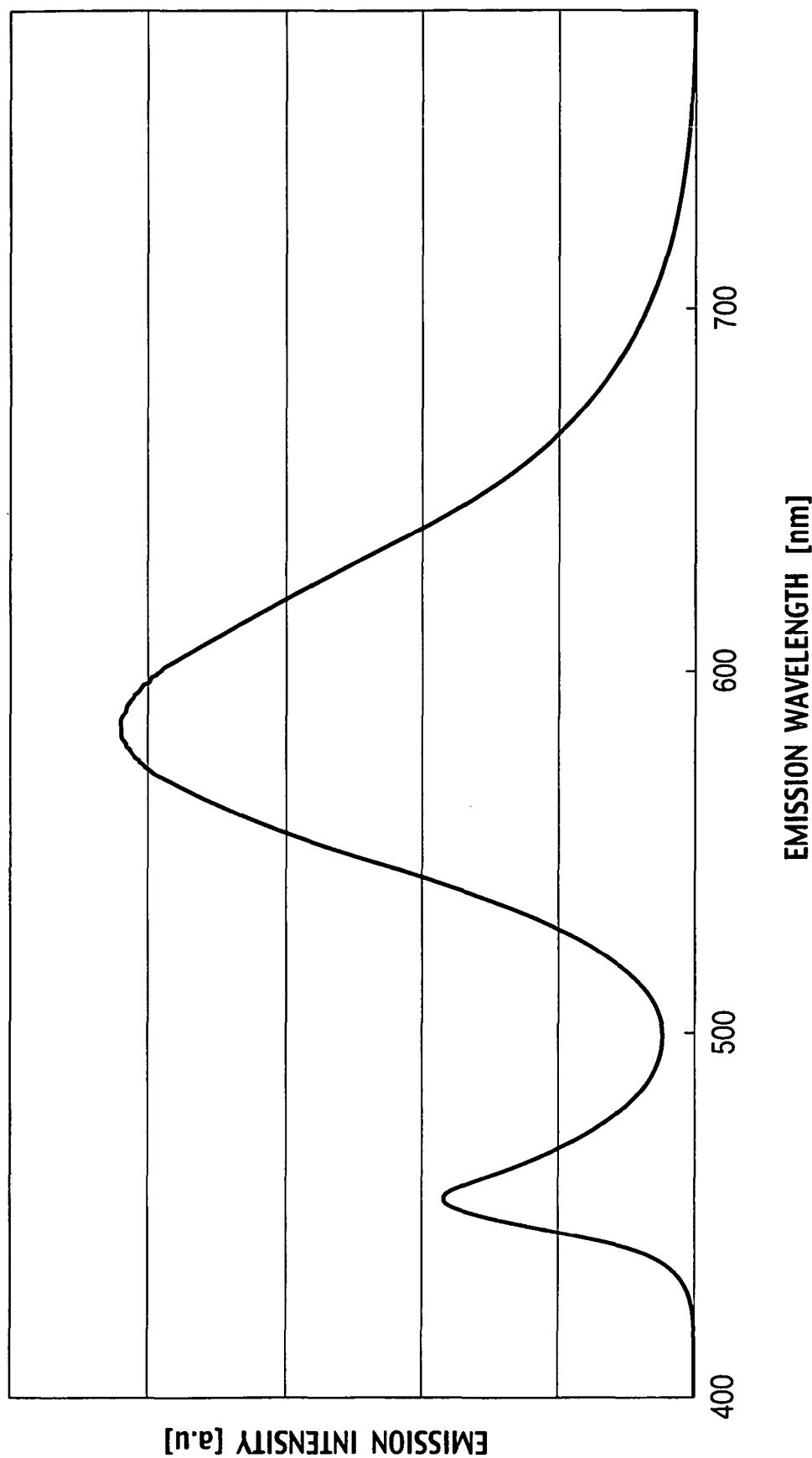
FIG. 26 illustrates an emission spectrum of the artillery shell type light emitting diode lamp in FIGS. 21 and 22.

FIG. 26 illustrates an emission spectrum of the artillery shell type light emitting diode lamp in FIGS. 21 and 22. As shown, the chromaticity coordinates of (x, y) are (0.457, 0.412) and a color temperature is 2750K. An emission efficiency is 13.2 lumens per watt (lm/W), which is indicative of a low color temperature light emitting diode lamp. Namely, the light emitting diode lamp 1a has high efficiency as a light emitting diode lamp that emits incandescent lamp color light.

A Second Embodiment

Next, a light emitting diode lamp according to a second embodiment (Embodiment 2) will be described. This light emitting diode lamp has the same structure as the artillery shell type light emitting diode lamp according to the first embodiment except for the following. Namely, the light emitting diode lamp according to the second embodiment uses a blue light emitting diode chip with higher emission efficiency than the blue light emitting diode chip used in the artillery shell type light emitting diode lamp according to the first embodiment and is fabricated by a slightly improved packaging process of the blue light emitting diode chip, thereby realizing an improvement in external emission efficiency. By the way, it is needless to say that the phosphor used is the sample Y6 in the artillery shell type light emitting diode lamp according to the first embodiment.

Figure 27:
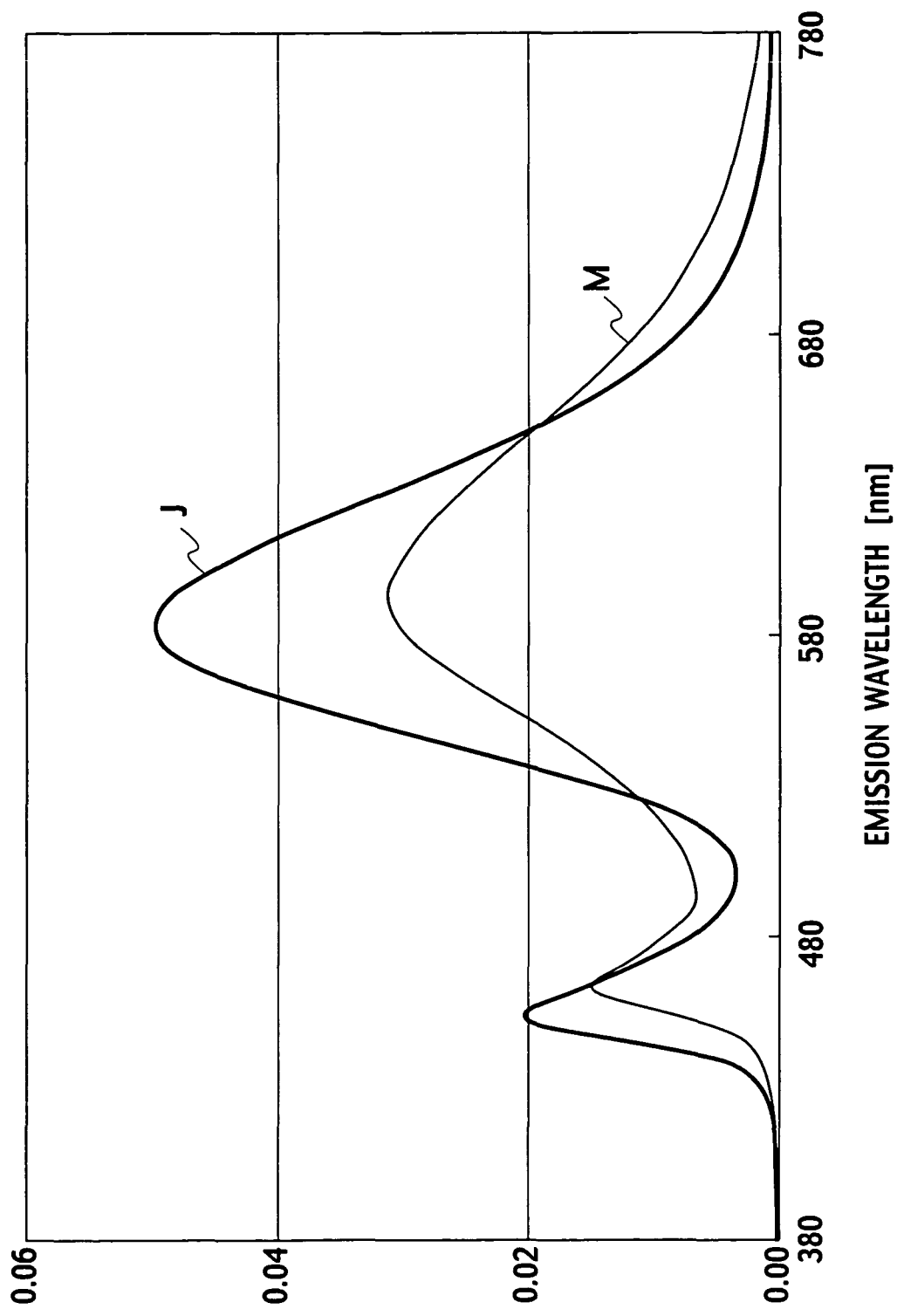
FIG. 27 illustrates an emission spectrum of the light emitting diode lamp according to a second embodiment of the present invention and an emission spectrum of a commercially available light emitting diode lamp for comparison.

FIG. 27 illustrates an emission spectrum J of the light emitting diode lamp according to the second embodiment. This light emitting diode lamp has a luminous efficacy of 36.3 lm/W, and a color temperature of 2780 K. In addition, the chromaticity of the light emitted therefrom is represented by (0.456, 0.414) according to the chromaticity coordinates of (x, y) on the CIE1931 chromaticity diagram. Moreover, the chromaticity corresponds to the incandescent lamp color which is defined along with the daylight color, the daylight-white color, the cool-white color, the warm-white color and the incandescent lamp color in Japanese Industrial Standard (JIS) Z 9112-1990 "Classification of fluorescent lamps by chromaticity and color rendering property". For comparison, a light emitting diode lamp having a chromaticity of an incandescent lamp color was chosen from various types of commercially available light emitting diode lamps and the emission spectrum thereof was measured. The result is also illustrated in FIG. 27 (emission spectrum M). Specifically, the commercially available white light emitting diode lamp for comparison has a luminous efficacy of 22.5 lm/W, a color temperature of 2,800 K, and the CIE1931 chromaticity coordinates (x, y) of (0.455, 0.415).

As illustrated in FIG. 27, the light emitting diode lamp according to the second embodiment has a higher emission intensity and is 1.6 times as bright in terms of the luminous efficacy, compared with the commercially available diode lamp.

A Third Embodiment

Figure 28:
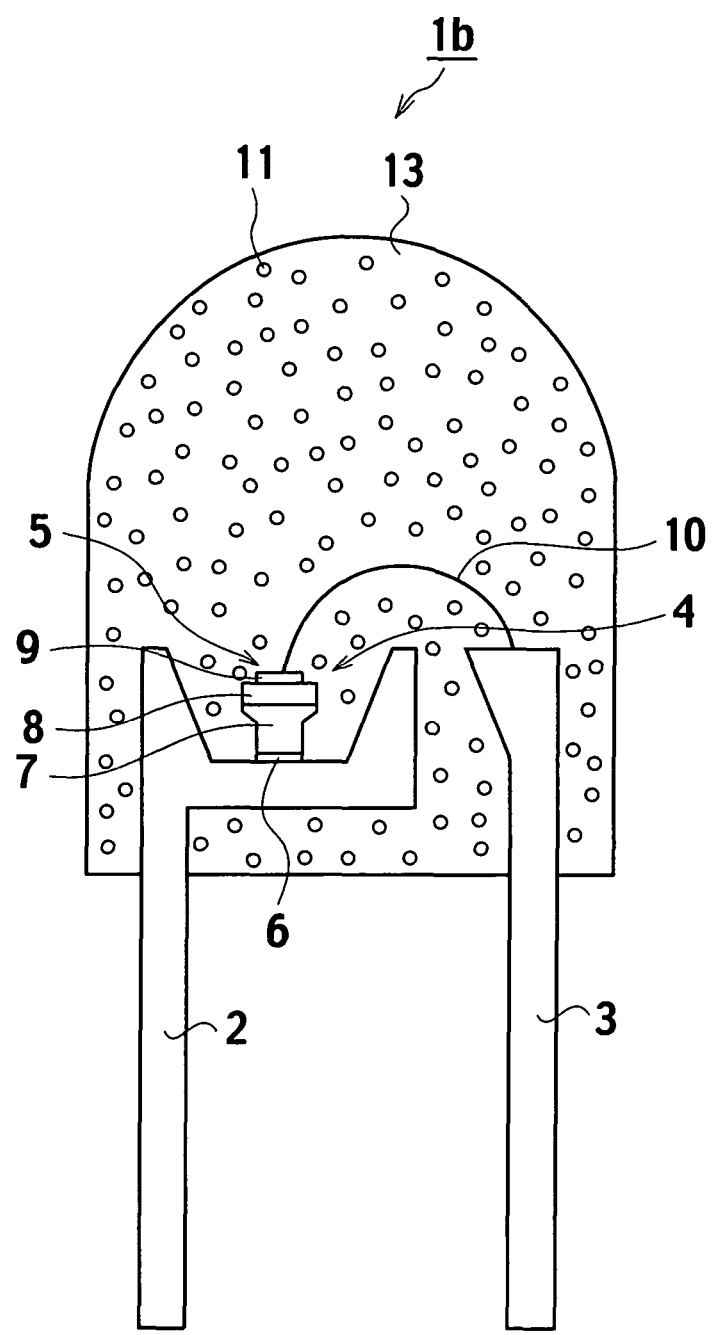
FIG. 28 is a cross-sectional view of an artillery shell type light emitting diode lamp according to a third embodiment.
Figure 29:
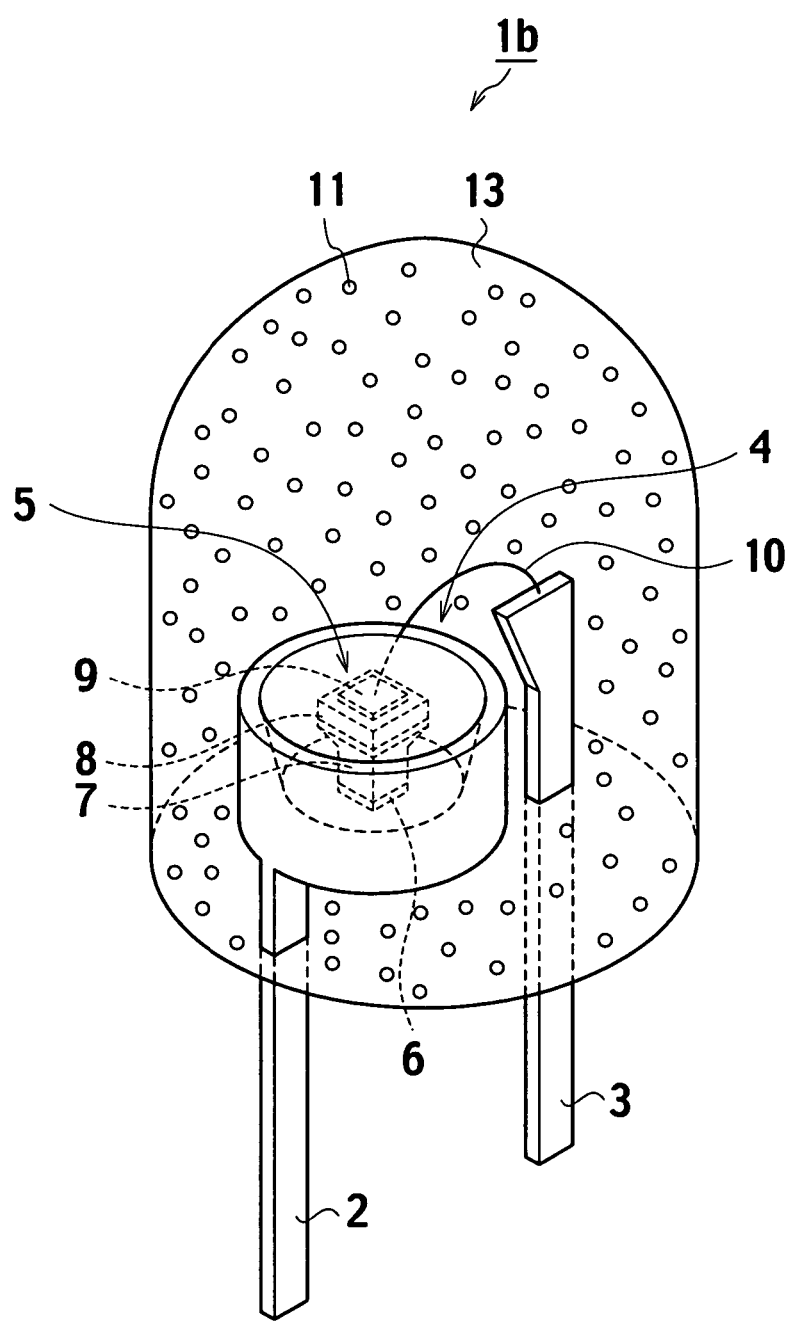
FIG. 29 is a perspective view of the artillery shell type light emitting diode lamp in FIG. 28.

FIG. 28 is a cross-sectional view of an artillery shell type light emitting diode lamp 1b according to a third embodiment (Embodiment 3) of the present invention. FIG. 29 is a perspective view of the artillery shell type light emitting diode lamp 1b.

In case of the artillery shell type light emitting diode lamp 1a illustrated in FIGS. 21 and 22, the phosphor 11 is dispersed in the vicinities of the blue light emitting diode chip 5, that is, in the resin 12. However, this does not limit the present invention. The artillery shell type light emitting diode lamp can be configured in such a way that the phosphor 11 is dispersed in resin 13, that is, entirely in the resin, as in this embodiment.

By the way, when fabricating the above artillery shell type light emitting diode lamp 1b, while the resin 12 is not cured, the phosphor 11 is dispersed in the resin 13 and then the resin 13 is cured.

A Fourth Embodiment

Figure 30:
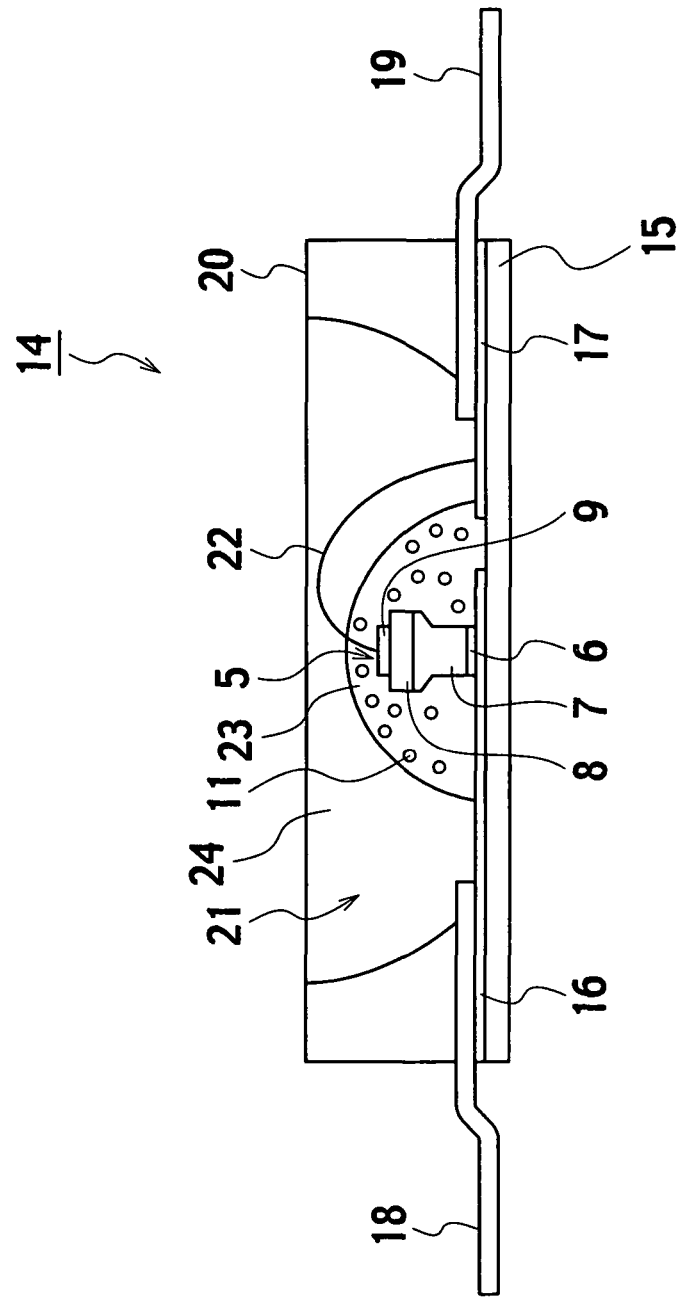
FIG. 30 is a cross-sectional view of a chip type light emitting diode lamp according to a fourth embodiment.
Figure 31:
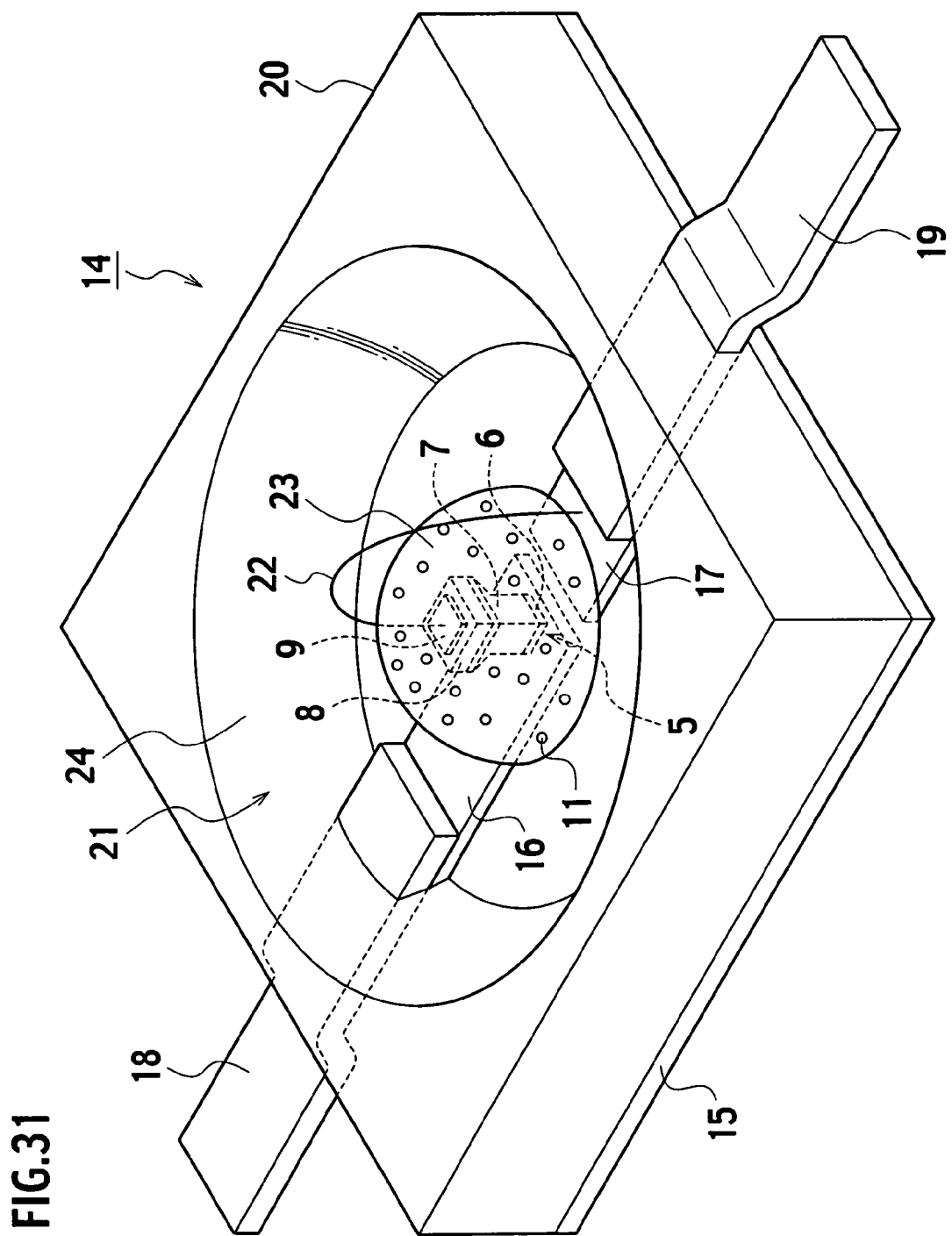
FIG. 31 is a perspective view of the chip type light emitting diode lamp in FIG. 30.

FIG. 30 is a cross-sectional view of a chip type light emitting diode lamp 14 according to a fourth embodiment (Embodiment 4). FIG. 31 is a perspective view of the chip type light emitting diode lamp 14.

The chip type light emitting diode lamp 14 is composed of a blue light emitting diode chip 5, an alumina ceramics substrate 15, electrode patterns 16, 17, lead wires 18, 19, a side face member 20, a bonding wire 22, resins 23, 24.

The alumina ceramics substrate 15 has a quadrangular shape and a high reflectivity of visible light.

On the upper face of the alumina ceramics substrate 15, there are formed two electrode patterns 16, 17 by sputtering. The electrode patterns 16, 17 have a thickness of several micrometers so that there is almost no step between the patterns and the alumina ceramics substrate 15.

To the electrode pattern 16 is connected to the lead wire 18 by a high-melting point solder or the like, whereas the electrode pattern 17 is connected to the lead wire 19 by a high-melting point solder or the like.

The end portion of the electrode pattern 16 is situated in the center of the alumina ceramics substrate 15. On the end portion, there is placed and fixed the blue light emitting diode chip 5.

A lower electrode 6 and the electrode pattern 16 are electrically connected with each other by electrically conductive paste.

In addition, the upper electrode 9 and the other electrode pattern 17 are electrically connected with each other by the bonding wire 22.

The phosphor 11 is dispersed into the resin 23 and the resin 23 entirely seals the blue light emitting diode chip 5.

The side face member 20 has a space portion 21 in the center thereof and is fixed on the alumina ceramics substrate 15.

The space portion 21 is to house the blue light emitting diode chip 5 and the resin 23 dispersed with the α-SiAlON phosphor 11. The inner face of the space portion 21 is sloped so as to serve as a reflection surface for reflecting light upward (frontward). The shape of the inner face is determined taking account of the reflection direction of the light.

In addition, at least the face serving as the reflection surface is formed of a material having a high reflectivity of visible light and having a color of white or metallic luster. In this embodiment, the side face member 20 is made of a white silicone resin.

The resin 24 fills the space portion 21 and also the resin 23 that seals the blue light emitting diode chip 5.

By the way, the resins 23, 24 are both transparent and the same epoxy resin.

A Fifth Embodiment

Figure 32:
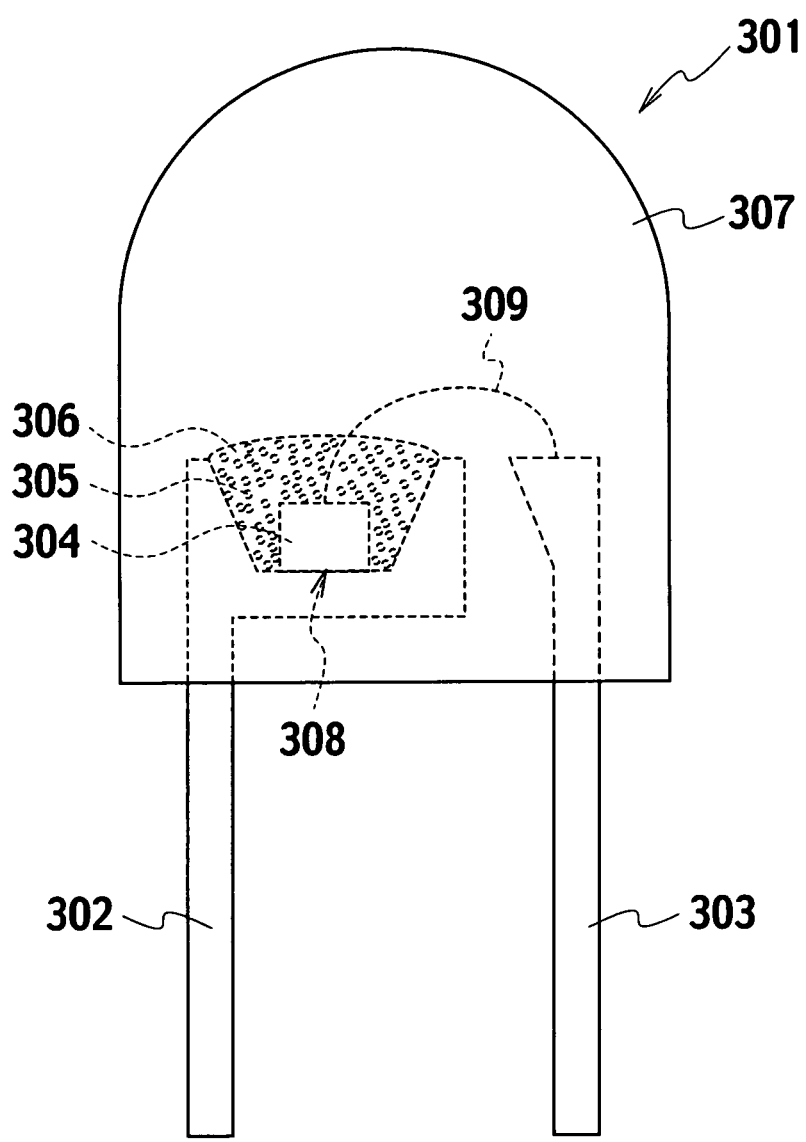
FIG. 32 is an entire view of a white light emitting diode lamp according to a fifth embodiment of the present invention.

Next, a white light emitting diode lamp according to a fifth embodiment (Embodiment 5) will be described. FIG. 32 illustrates a structure of an artillery shell type light emitting diode lamp.

A white light emitting diode lamp 301 is mainly composed of a first lead wire 302 made of an electrically conductive material, a second lead wire 303, a blue light emitting diode chip 304, a first resin 306 dispersed with a phosphor 305, and a second resin 307.

On one end of the first lead wire 302, there is formed a cup 308 in which a blue light emitting diode chip 304 is placed. As the blue light emitting diode chip 304, for example, an InGaN blue light emitting diode chip that emits light having a wavelength of from 430 to 470 nm is preferable.

One electrode of the blue light emitting diode lamp 304 is electrically connected with a bottom face of the cup 308 by an electrically conductive paste. The other electrode is electrically connected with the second lead wire 303 by a fine metal wire 309.

The blue light emitting diode chip 304 is entirely covered with the first resin 306 dispersed with a predetermined amount of the phosphor 305 according to the present invention. By the way, the first resin 306 is transparent and can be an epoxy resin or the like, for example.

One end portion of the second lead wire 303 and the first lead wire 302 including the cup 308, the blue light emitting diode chip 304, and the first resin 306 dispersed with the phosphor 305 are entirely covered and sealed with the second resin 307 which is transparent.

The second resin 307 has a shape that can give a predetermined directivity for the light emitted therefrom, for example, substantially a round shape. Since the tip of the second resin 307 is formed into a shape of convex, the diode lamp is generally referred to as an artillery shape. The second resin 307 is for example an epoxy resin or the like.

The other end portion of the first lead wire 302 and the second lead wire 303 are exposed out from the second resin 307. The exposed portion thereof is soldered to a circuit board for example with a solder and thus electrically connected with an outer circuit. By providing electricity between the first lead wire 302 and the second lead wire 303, the blue light emitting diode chip 304 emits light.

The above white light emitting diode lamp 301 emits white light obtained in such a way that the blue light emitting diode chip 304 as a blue light source emits blue light and the blue light is wavelength-converted by the phosphor 305. Namely, the white light emitted from the white light emitting diode lamp 301 is obtained by a mixture of light, that is, a mixture of the blue light emitted from the blue light emitting diode chip 304 as a light source and the yellow light emitted from the phosphor 305.

By using the α-SiAlON phosphor according to the present invention as the phosphor 305, the white light emitting diode lamp 301 can emit warm-tone light having a low color temperature. In addition, with such a phosphor, the white light emitting diode lamp 301 exhibits a higher emission intensity and is brighter than a white light emitting diode using a conventional α-SiAlON phosphor.

By the way, although the blue light emitting diode chip is used as a light emitting element in the above explanation, the α-SiAlON according to the present invention can be excited by near ultraviolet light with high efficiency. Therefore, the phosphor is suitably used as a yellow light producer for a near-ultraviolet excitation type white light emitting diode lamp by mixing the phosphor with other phosphors.

In case of a near-ultraviolet excitation, an ultraviolet light emitting diode chip is used and at the same time a mixture of two to five kinds of powder phosphors, one of which is the phosphor according to the present invention, is used.

The phosphors to be mixed with the phosphor according to the present invention are not limited and various types of known phosphors can be used depending on an application.

In the foregoing, the phosphor and the light emitting device according to the present invention have been described. However, the present invention is not limited to the above embodiments and can be modified arbitrarily without departing from the scope of the present invention.

For example, the artillery shell type light emitting diode lamp is exemplified as a light emitting device using the phosphor in the above explanation. However, the phosphor according to the present invention can be used in any light emitting diode lamp other than the artillery shell type light emitting diode lamp, or any light emitting device other than an light emitting diode lamp.

Next, the sample F4 as the α-SiAlON phosphor is used to fabricate an artillery shell type white light emitting diode lamp as illustrated in FIG. 32. A fabrication procedure will be explained hereinafter.

As lead wires, a pair of lead wires (a first lead wire and a second lead wire) that had been integrally molded was used.

In a first process, a blue light emitting diode chip having a peak emission wavelength of 450 nm is placed in a cup provided in one end of the first lead wire. Then, one electrode of the diode chip and the first lead wire were electrically connected with each other by die-bonding using an electrically conductive paste.

In a second process, the other electrode of the blue light emitting diode chip and the second lead wire are electrically connected by wire-bonding using a fine gold wire.

In a third process, an appropriate amount of a first resin dispersed with 25 wt % of mixed phosphor powders was pre-deposited by applying the resin to cover the blue light emitting diode chip and then cured. The first resin was an epoxy resin. By the way, the applied amount of the first resin was adjusted to be appropriate amount determined by the experiment carried out in advance.

In a fourth process, a second resin is applied so as to enfold the blue light emitting diode chip and the first resin by a casting method and then cured. The second resin was the same epoxy resin as the first resin.

In a fifth process, a connecting portion that connects the first lead wire and the second lead wire was severed.

The white light emitting diode so fabricated emits white light produced by the light (wavelength of about 450 nm) emitted from the blue light emitting diode chip and the light (wavelength of about 580 nm) emitted from the phosphor.

By using the blue light emitting diode chip having a center emission wavelength of 450 nm and the sample F4 ($\alpha$-SiAlON phosphor), the white light emitting diode lamp that emits warm-tone color light having a low color temperature can be realized. The emission intensity is much higher than a white light emitting diode using a conventional phosphor.

Although the present invention has been described in reference with the foregoing specific embodiments, other alternatives, variations and modifications will be apparent to one skilled in the art. Those alternatives, variations and modifications are intended to fall within the spirit and scope of the appended claims.

What is claimed is:

1. A phosphor comprising:
an oxynitride $\alpha$-SiAlON phosphor represented by a general formula of $Ca_p Eu_q Si_{12-(m+n)} Al_{(m+n)}(O, N)_{16}$, wherein $m=(2\times p+3\times q)$, $n=(2\times p+3\times q)/2$, m and n are any numbers greater than 0 and satisfy an inequality of $m+n<12$,
wherein a main phase of the $\alpha$-SiAlON phosphor has an $\alpha$-SiAlON structure; wherein $0.75 \leq p \leq 1.0$ and $0.02 < q < 0.09$, and
wherein the $\alpha$-SiAlON phosphor is obtained by mixing starting materials including Silicon Nitride powder, Calcium Carbonate powder, Aluminum Nitride powder, and Europium Oxide powder at a mixing ratio designed to give a design composition of $Ca_p Eu_q Si_{12-(m+n)} Al_{(m+n)} O_n N_{16-n}$; and sintering the starting materials.

2. A phosphor recited in claim 1, wherein $0.03 \leq q \leq 0.08$ in said formula.

3. A phosphor recited in any one of claims 1 to 2, wherein said $\alpha$-SiAlON phosphor is obtained by mixing the starting materials, drying the mixed materials, sifting aggregate having a predetermined particle size, charging the sifted materials that remain in power form of powder density of equal to or less than 20% into a sintering furnace, and sintering the materials under a nitrogen atmosphere.

4. A phosphor recited in claim 3, wherein aggregates having a particle size of 45 micrometers or smaller are sorted.

5. A phosphor recited in claim 4, wherein said $\alpha$-SiAlON phosphor is gas-pressure-sintered under a nitrogen pressure of equal to or greater than 2 atm.

6. A phosphor recited in any one of claim 4, wherein said $\alpha$-SiAlON phosphor is sintered at a temperature of from 1650 degrees Celsius to 1750 degrees Celsius.

7. A phosphor recited in claim 6, wherein said $\alpha$-SiAlON phosphor is sintered by retaining said temperature for 20 hours or more.

8. A phosphor recited in any of claim 4, wherein said $\alpha$-SiAlON phosphor is obtained by mixing with n-hexane as a solvent.

9. A phosphor recited in any one of claim 4, wherein said $\alpha$-SiAlON phosphor is charged into a container with a cover made of Boron Nitride and sintered in a sintering furnace while kept in said container with a cover.

10. An incandescent lamp color light emitting diode lamp comprising:
a semiconductor blue light emitting diode chip having a center emission wavelength in a range of from 400 nm to 480 nm, and
an $\alpha$-SiAlON phosphor that absorbs part of the light emitted from said semiconductor blue light emitting diode chip and emits light having a different wavelength from the light emitted from the diode chip,
wherein said $\alpha$-SiAlON phosphor is a phosphor recited in any one of the claims 1-2,
a chromaticity range of the light emitted as a result of a mixture of the light emitted from said semiconductor blue light emitting diode chip and the light emitted from said $\alpha$-SiAlON phosphor is in an incandescent lamp color area in the XYZ chromaticity diagram, the area being represented by a tetragon defined by chromaticity coordinates (x, y) of (0.4775, 0.4283), (0.4594, 0.3971), (0.4348, 0.4185), and (0.4214, 0.3887) on the diagram.

11. An incandescent lamp color light emitting diode lamp as recited in claim 10, wherein $0.03 \leq q \leq 0.07$ in said formula.

12. An incandescent lamp color light emitting diode lamp as recited in claim 11, wherein said $\alpha$-SiAlON phosphor is powdery having a particle size of 45 micrometers or smaller and implemented in said light emitting diode lamp while being dispersed in a resin.

13. An incandescent lamp color light emitting diode lamp as recited in claim 12, wherein said $\alpha$-SiAlON phosphor is powdery having a particle size of 20 micrometers or smaller.

14. An incandescent lamp color light emitting diode lamp as recited in claim 12, wherein a ratio of said $\alpha$-SiAlON phosphor powders having a particle size of 2 micrometers or smaller to the whole amount is 10% or less.

* * * * *